(12) United States Patent
Zheng et al.

(10) Patent No.: US 11,463,108 B2
(45) Date of Patent: *Oct. 4, 2022

(54) INFORMATION PROCESSING METHOD AND COMMUNICATIONS APPARATUS

(71) Applicant: HUAWEI TECHNOLOGIES CO., LTD., Shenzhen (CN)

(72) Inventors: Chen Zheng, Shanghai (CN); Yuejun Wei, Shanghai (CN); Liang Ma, Shanghai (CN); Xiaojian Liu, Shenzhen (CN); Xin Zeng, Shenzhen (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 23 days.

This patent is subject to a terminal disclaimer.

(21) Appl. No.: 16/691,281

(22) Filed: Nov. 21, 2019

(65) Prior Publication Data

US 2020/0091934 A1 Mar. 19, 2020

Related U.S. Application Data

(63) Continuation of application No. PCT/CN2017/086500, filed on May 29, 2017.

(30) Foreign Application Priority Data

May 28, 2017 (WO) ................ PCT/CN2017/086458

(51) Int. Cl.
*H03M 13/00* (2006.01)
*H03M 13/11* (2006.01)
*H03M 13/27* (2006.01)

(52) U.S. Cl.
CPC ......... *H03M 13/116* (2013.01); *H03M 13/27* (2013.01)

(58) Field of Classification Search
CPC ........................... H03M 13/116; H03M 13/27
See application file for complete search history.

(56) References Cited

U.S. PATENT DOCUMENTS

| 7,630,456 B2 | 12/2009 | Mogre et al. |
| 8,392,789 B2 | 3/2013 | Biscondi et al. |

(Continued)

FOREIGN PATENT DOCUMENTS

| CN | 1805291 A | 7/2006 |
| CN | 101005334 A | 7/2007 |

(Continued)

OTHER PUBLICATIONS

Huawei et al: LDPC design for eMBB data, 3GPP Draft; R1-1704250, Apr. 2, 2017 (Apr. 2, 2017), XP051242402,total 6 pages.

(Continued)

*Primary Examiner* — Samir W Rizk
(74) *Attorney, Agent, or Firm* — Womble Bond Dickinson (US) LLP

(57) ABSTRACT

This application discloses an information processing method and apparatus, a communications device, and a communications system. The method includes: encoding an input sequence by using a low-density parity-check (LDPC) matrix, to obtain a bit sequence D, where a base matrix of the LDPC matrix is represented as a matrix of m rows and n columns, each column corresponds to a group of Z consecutive bits in the bit sequence D, and n and Z are both integers greater than 0; and obtaining an output bit sequence based on a bit sequence V, where the bit sequence V is obtained by permuting two groups of bits corresponding to at least two parity check columns in the bit sequence D.

25 Claims, 10 Drawing Sheets

(56) References Cited

U.S. PATENT DOCUMENTS

| | | | |
|---|---|---|---|
| 9,104,589 | B1 | 8/2015 | Landon et al. |
| 9,112,534 | B2 | 8/2015 | Fonseka et al. |
| 2004/0187129 | A1 | 9/2004 | Richardson |
| 2007/0043998 | A1 | 2/2007 | Lakkis |
| 2008/0178065 | A1 | 7/2008 | Khandekar et al. |
| 2009/0083604 | A1 | 3/2009 | Tong et al. |
| 2009/0249157 | A1 | 10/2009 | Lee et al. |
| 2011/0307755 | A1* | 12/2011 | Livshitz ............ H03M 13/6393 714/752 |
| 2013/0317813 | A1 | 11/2013 | Gao |
| 2014/0153625 | A1 | 6/2014 | Vojcic et al. |
| 2014/0223254 | A1 | 8/2014 | Pisek |
| 2015/0039963 | A1 | 2/2015 | Fonseka et al. |
| 2016/0013809 | A1 | 1/2016 | Myung et al. |
| 2016/0352419 | A1 | 12/2016 | Fonseka et al. |
| 2020/0106458 | A1* | 4/2020 | Jin .................... H03M 13/1148 |

FOREIGN PATENT DOCUMENTS

| | | |
|---|---|---|
| CN | 101192833 A | 6/2008 |
| CN | 101217284 A | 7/2008 |
| CN | 101217337 A | 7/2008 |
| CN | 101399554 A | 4/2009 |
| CN | 101490963 A | 7/2009 |
| CN | 101515839 A | 8/2009 |
| CN | 101686061 A | 3/2010 |
| CN | 102868483 A | 1/2013 |
| CN | 103560993 A | 2/2014 |
| CN | 104579576 A | 4/2015 |
| EP | 3641172 A1 | 4/2020 |
| WO | 2015002507 A1 | 1/2015 |

OTHER PUBLICATIONS

Gallager R G. Low-density parity-check codes[J]. Information Theory, IRE Transactions on, 1962, 8(1): 21-28 , total 8 pages.

ZTE et al.,"Compact LDPC design for eMBB",3GPP TSG RAN WG1 AH NR Meeting R1-1701473,Spokane, USA Jan. 16-20, 2017,Total 19 Pages.

IEEE Std 802.11 ad-2012 Part 11: Wireless LAN Medium Access Control (MAC) and Physical Layer (PHY) Specifications. Amendment 3: Enhancements for Very High Throughput in the 60 GHz Band.IEEE Computer Society, dated Oct. 19, 2012,total 628 pages.

ZTE et al.,"Compact LDPC design for eMBB",3GPP TSG RAN WG1 AH NR Meeting,R1-1700247,Spokane, USA Jan. 16-2o, 2017,Total 16 Pages.

ZTE et al: "Compact LDPC design for eMBB",3GPP Draft; R1-1701473 ,Jan. 20, 2017, XP051222469,total 19 pages.

ZTE et al: "Compact LDPC design for eMBB",3GPP Draft; R1-1700247,Jan. 10, 2017, XP051202750,total 16 pages.

* cited by examiner

CONT. FROM FIG. 3A

INFORMATION PROCESSING METHOD AND COMMUNICATIONS APPARATUS

CROSS-REFERENCE TO RELATED APPLICATIONS

This application is a continuation of International Application No. PCT/CN2017/086500, filed on May 29, 2017, which claims priority to International Application No. PCT/CN2017/086458, filed on May 28, 2017. The disclosures of the aforementioned applications are hereby incorporated by reference in their entireties.

TECHNICAL FIELD

Embodiments of the present disclosure relate to the communications field, and in particular, to an information processing method and a communications apparatus.

BACKGROUND

A low-density parity-check (LDPC) code is a type of linear block code having a sparse check matrix, and is characterized by flexible structure and low decoding complexity. Because decoding the LDPC code uses a partially-parallel iteration decoding algorithm, the LDPC code has a higher throughput than a conventional turbo code. The LDPC code can be used as an error-correcting code in a communication system, so as to increase reliability and power utilization of channel transmission. LDPC codes may be further widely applied to space communications, fiber optic communications, personal communications systems, asymmetric digital subscriber lines (ADSLs), magnetic recording devices, and the like. Currently, in the $5^{th}$ generation mobile communications, LDPC code has been considered as one of channel coding schemes.

In actual application, LDPC matrices characterized by a special structure may be used. An LDPC matrix H, characterized by a special structure may be obtained by expanding an LDPC base matrix having a quasi-cycle (QC) structure.

Generally, lengths of to-be-encoded information bit sequences vary from tens to hundreds of bits, and code rates required by a communications system are also flexibly variable. When the code rate is relatively high, an encoded bit sequence usually needs to be punctured. However, puncturing the bit sequence affects performance of the LDPC code.

SUMMARY

Embodiments of the present disclosure provide an information processing method and a communications apparatus and system, to satisfy a performance requirement on an LDPC code at a high code rate.

According to a first aspect, an information processing method is provided. The method includes:
encoding an input sequence by using a low-density parity-check LDPC matrix, to obtain a bit sequence D, where a base matrix of the LDPC matrix is represented as a matrix of m rows and n columns, each column corresponds to a group of Z consecutive bits in the bit sequence D, and n and Z are both integers greater than 0; and
obtaining an output bit sequence based on a bit sequence V, where the bit sequence V is obtained by permuting two groups of bits corresponding to at least two parity check columns in the bit sequence D, the at least two parity check columns are at least two of column (n−m) to column (n−1) of the base matrix, group j of Z consecutive bits in the bit sequence V is group P(j) of Z consecutive bits in the bit sequence D, j is an integer, and $0 \leq j < n$.

According to a second aspect, an information processing method is provided. The method includes:
obtaining a soft value sequence V' based on a signal encoded based on a low-density parity-check LDPC matrix; and
decoding a soft value sequence D' by using the LDPC matrix, where
a base matrix of the LDPC matrix is represented as a matrix of m rows and n columns, each column corresponds to a group of Z consecutive soft value bits in the soft value sequence D', and n and Z are both integers greater than 0;
group j of Z consecutive soft value bits in the soft value sequence V' is group P(j) of Z consecutive soft value bits in the soft value sequence D', j is an integer, and $0 \leq j < n$; and
the soft value sequence V' is obtained by permuting two groups of bits corresponding to at least two parity check columns in the soft value sequence D', and the at least two parity check columns are at least two of column (n−m) to column (n−1) of the base matrix.

In a first implementation of the first aspect or the second aspect, the at least two parity check columns are at least two columns in $\{P(a+i)|0 \leq i < 6\}$ of the base matrix, and $\{P(a+i)|0 \leq i < 6\} = \{22, 23, 24, 25, 26, 27\}$.

The bit sequence V is obtained by permuting at least two groups of Z consecutive bits in $\{P(a+i)|0 \leq i < 6\}$ in the bit sequence D. Alternatively, the soft value sequence V' is obtained by permuting at least two groups of Z consecutive bits in $\{P(a+i)|0 \leq i < 6\}$ in the soft value sequence D'.

In another implementation, P(a+5)=26, and P(a+4)=24 or P(a+4)=25; or
P(a+5)=25, and P(a+4)=24 or P(a+4)=26; or
P(a+5)=24, and P(a+4)=23 or P(a+4)=25 or P(a+4)=26; or
P(a+5)=23, and P(a+4)=24.

Based on the foregoing implementation, a=20, or a=22.
Optionally, $\{P(a+i)|0 \leq i < 6\}$ includes any group of values in Table 1 to Table 8.

Based on the foregoing implementation, in still another implementation,
the output bit sequence is obtained by using bit 0 of the bit sequence V as a start location when a=20; or
the output bit sequence is obtained by using bit 0 of the bit sequence V as a start location when a=20, where the output bit sequence does not include group 0 of bits and group 1 of bits in the bit sequence D; or
the output bit sequence is obtained by using bit 2*Z of the bit sequence V as a start location when a=22.

Based on any one of the foregoing aspects or the implementations of the aspects, in still another implementation, the base matrix of the LDPC matrix may be stored in a memory.

Based on any one of the foregoing aspects or the implementations of the aspects, in still another implementation, a base graph of the LDPC matrix is stored in the memory, and a shift value of a non-zero entry in the base matrix of the LDPC matrix may be stored in the memory.

According to a third aspect, a communications apparatus is provided, and the apparatus may include a module configured to perform any implementation of the first aspect in the foregoing method design. The module may be software and/or hardware.

In an embodiment, the communications apparatus provided in the third aspect includes an encoding unit and a processing unit that perform the method according to the first aspect. The encoding unit is configured to encode an input sequence by using a low-density parity-check LDPC matrix, to obtain a bit sequence D. The processing unit is configured to obtain an output bit sequence based on a bit sequence V.

Optionally, the communications apparatus further includes a transceiver, and the transceiver is configured to send a signal corresponding to encoded information data.

According to a fourth aspect, a communications apparatus is provided, and the apparatus may include a module configured to perform any implementation of the second aspect in the foregoing method design. The module may be software and/or hardware.

In an embodiment, the communications apparatus provided in the fourth aspect includes a decoding unit and a processing unit that perform the method according to the second aspect. The processing unit is configured to obtain a soft value sequence V' based on a signal encoded based on a low-density parity-check LDPC matrix. The decoding unit is configured to decode a soft value sequence D' by using the LDPC matrix.

The communications apparatus further includes a transceiver, and the transceiver is configured to receive the signal encoded based on the LDPC matrix.

According to a fifth aspect, a communications apparatus is provided, and the apparatus includes one or more processors.

In an embodiment, the one or more processors may implement the information processing method according to the first aspect or functions of the communications apparatus according to the third aspect. In another embodiment, the processor may further implement other functions in addition to the functions of the information processing method according to the first aspect.

In an embodiment, the one or more processors may implement the information processing method according to the second aspect. In another embodiment, the processor may further implement other functions in addition to the functions of the information processing method according to the second aspect.

Optionally, the communications apparatus may further include a transceiver and an antenna.

Optionally, the communications apparatus may further include a component configured to produce a transport block cyclic redundancy check (CRC), a component used for code block segmentation and a CRC check, an interleaver used for interleaving, a modulator used for modulation processing, or the like.

Optionally, the communications apparatus may further include a demodulator used for a demodulation operation, a deinterleaver used for deinterleaving, a component used for rate de-matching, or the like. Functions of the components may be implemented by using the one or more processors.

In an embodiment, functions of the components may be implemented by using the one or more processors.

According to a sixth aspect, an embodiment of the present disclosure provides a communications system, and the system includes the communications apparatus according to the third aspect and the communications apparatus according to the fourth aspect.

According to a seventh aspect, an embodiment of the present disclosure provides a communications system, and the system includes one or more communications apparatuses according to the fifth aspect.

According to another aspect, an embodiment of the present disclosure provides a computer storage medium. The computer storage medium stores a program. When run, the program enables a computer to execute the methods according to the foregoing aspects.

According to still another aspect of this application, a computer program product that includes an instruction is provided. When the computer program product is run on a computer, the computer is enabled to perform the methods according to the foregoing aspects.

According to the information processing method and apparatus, the communications device, and the communications system in the embodiments of the present disclosure, a performance requirement on an LDPC code at a high code rate can be satisfied.

BRIEF DESCRIPTION OF DRAWINGS

FIG. 3A and FIG. 3B are a schematic diagram of a base graph and a base matrix of an LDPC code according to an embodiment of the present disclosure;

FIG. 9 is a schematic diagram of a base graph of an LDPC code according to an embodiment of the present disclosure; and FIG. 10 is a schematic diagram of a base graph of an LDPC code according to an embodiment of the present disclosure.

DESCRIPTION OF EMBODIMENTS

For ease of understanding, some terms in this application are described below.

In this application, terms "network" and "system" are often alternately used, and "apparatus" and "device" are also often alternately used, but a person skilled in the art may understand their meanings. A "communications apparatus" may be a chip (for example, a baseband chip, a data signal processing chip, or a general-purpose chip), a terminal, a base station, or another network device. A terminal is a device having a communication function, and may include a handheld device, an in-vehicle device, a wearable device, a computing device that has a wireless communication function, or another processing device connected to a wireless modem. The terminal may have different names in different networks, for example, user equipment, a mobile station, a subscriber unit, a station, a cellular phone, a personal digital assistant, a wireless modem, a wireless communications device, a handheld device, a laptop computer, a cordless telephone set, and a wireless local loop station. For ease of description, the terminal device is briefly referred to as a terminal in this application. A base station (BS) may also be referred to as a base station device, and is a device deployed in a radio access network to provide a wireless communication function. In different wireless access systems, the base station may have different names. For example, a base station in a universal mobile telecommunications system (UMTS) network is referred to as a NodeB (NodeB), a base station in an LTE network is referred to as an evolved NodeB (eNB or eNodeB), a base station in a new radio (NR) network is referred to as a transmission/reception point (TRP) or a next generation NodeB (gNB), or base stations in various other evolved networks may also have other names. The present disclosure is not limited thereto.

The following describes the technical solutions in embodiments of the present disclosure with reference to the accompanying drawings in the embodiments of the present disclosure.

Figure 1:
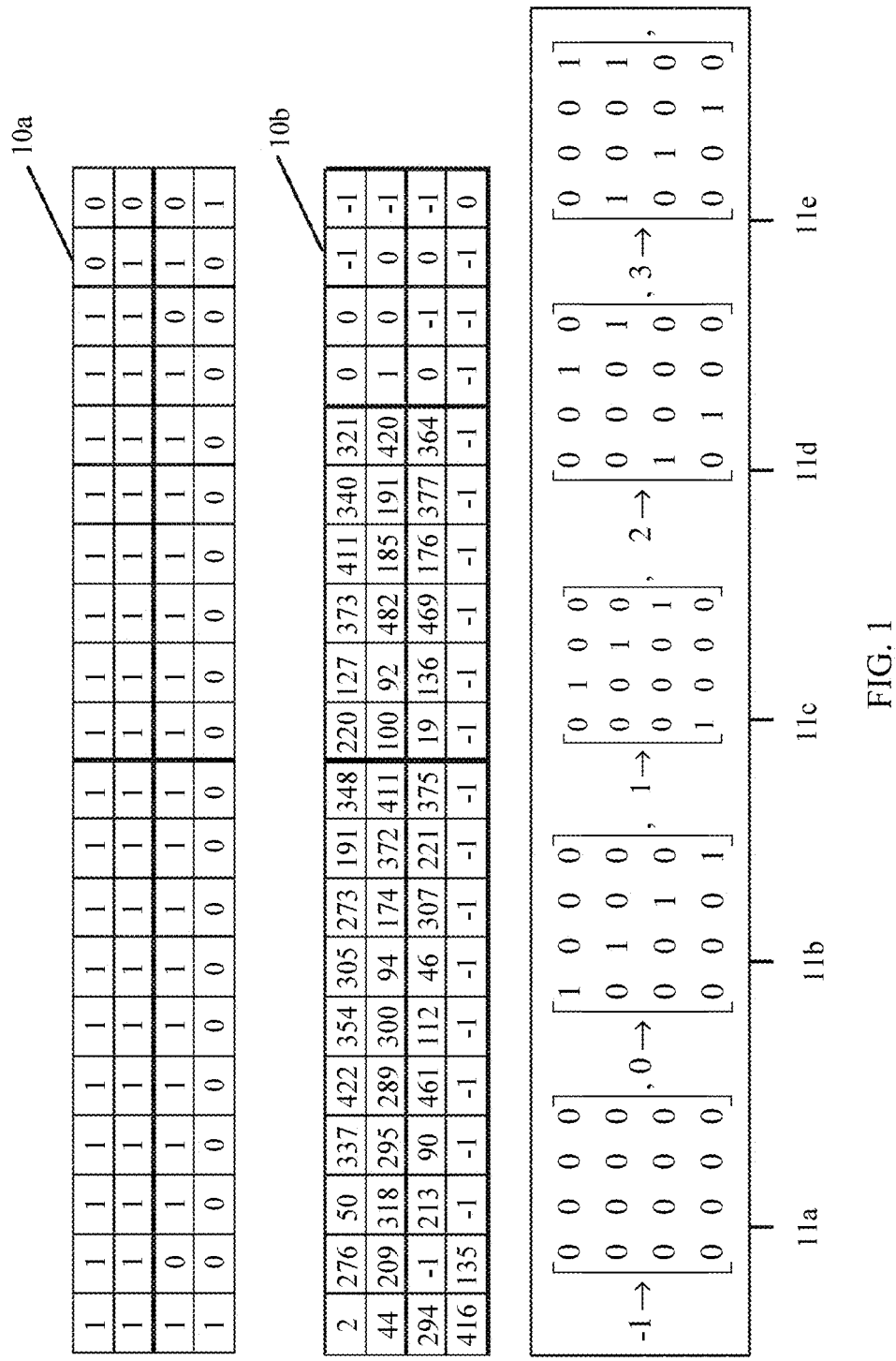
FIG. 1 is a schematic diagram of a base graph, a base matrix, and circular permutation matrices of an LDPC code.

An LDPC code may usually be represented by using a parity check matrix H. The parity check matrix H of the LDPC code may be obtained by using a base graph and a shift value. The base graph may usually include m*n matrix elements (entry), and may be represented in a form of a matrix of m rows and n columns. A value of a matrix element is 0 or 1. An element whose value is 0 is sometimes referred to as a zero entry, indicating that the element may be replaced with a Z*Z all-zero matrix. An element whose value is 1 is sometimes referred to as a non-zero element, indicating that the element may be replaced with a Z*Z circular permutation matrix. That is, each matrix element represents an all-zero matrix or a circular permutation matrix. 10a in FIG. 1 shows an example of elements in a base graph that is of an LDPC code and that has a QC structure, where m=4, and n=20. It should be noted that in this specification, row numbers and column numbers of a base graph and a base matrix all start from 0. This is only for convenience of understanding. The row numbers and the column numbers may alternatively start from 1, and the corresponding row numbers and column numbers are obtained by adding 1 to the row numbers and the column numbers described in this specification.

If an element at row i and column j in the base graph has a value of 1 and a shift value of $P_{i,j}$, where $P_{i,j}$ is an integer greater than or equal to 0, it indicates that the element in the row i and the column j whose value is 1 may be replaced with a Z*Z circular permutation matrix corresponding to $P_{i,j}$, and the circular permutation matrix may be obtained by circularly shifting an identity matrix of size Z*Z to right for $P_{i,j}$ times. It may be learned that if each element whose value is 0 in the base graph is replaced with an all-zero matrix of size Z*Z, and each entry whose value is 1 is replaced with a circular permutation matrix of size Z*Z corresponding to a shift value of the element, the parity check matrix of the LDPC code may be obtained. Z is a positive integer and may be referred to as a lifting (lifting) factor, and may be determined based on a code block size and an information data size that are supported by a system. It may be learned that a size of the parity check matrix H is (m*Z)*(n*Z). For example, if the lifting factor Z=4, each zero element is replaced with an all-zero matrix 11a whose size is 4*4. If $P_{2,3}=2$, a non-zero element in the second row and the third column is replaced with a 4*4 circular permutation matrix 11d. The matrix is obtained by performing right cyclic shift twice on a 4*4 identity matrix 11b. If $P_{2,4}=0$, the non-zero entry in the second row and the third column is replaced with the identity matrix 11b. It should be noted that this is merely an example for description herein, and the present disclosure is not limited hereto.

Because $P_{i,j}$ may be obtained based on the lifting factor Z, for an element whose value is 1 at a same location, different $P_{i,j}$ values may be obtained by using different lifting factors Z. To simplify implementation, usually, a base matrix of m rows and n columns is also defined in the system, and a location of each element in the base matrix and a location of each element in the base graph are in a one-to-one correspondence. The zero element in the base graph has a fixed location in the base matrix and is represented by −1, and the non-zero element whose value is 1 at the row i and column j in the base graph has a fixed location in the base matrix and may be represented by $P_{i,j}$. $P_{i,j}$ is a positive integer greater than or equal to 0. In this embodiment of this application, the base matrix is also referred to as a shift matrix of a base graph matrix sometimes. If an input sequence is encoded based on the base matrix of m rows and n columns, each column in the base matrix may correspond to Z consecutive bits in an encoded bit sequence.

10b in FIG. 1 shows a base matrix corresponding to the base graph 10a.

Usually, a base graph or a base matrix of an LDPC code may further include p built-in puncture bit columns, where p may be an integer from 0 to 2. The columns are used for encoding. However, systematic bits corresponding to the columns after encoding are not sent. A code rate of the base matrix of the LDPC code satisfies R=(n−m)/(n−p). For a base matrix of four rows and 20 columns (4*20), if there are two built-in puncture bit columns, a code rate is: (20−4)/(20−2)=8/9.

Figure 2:
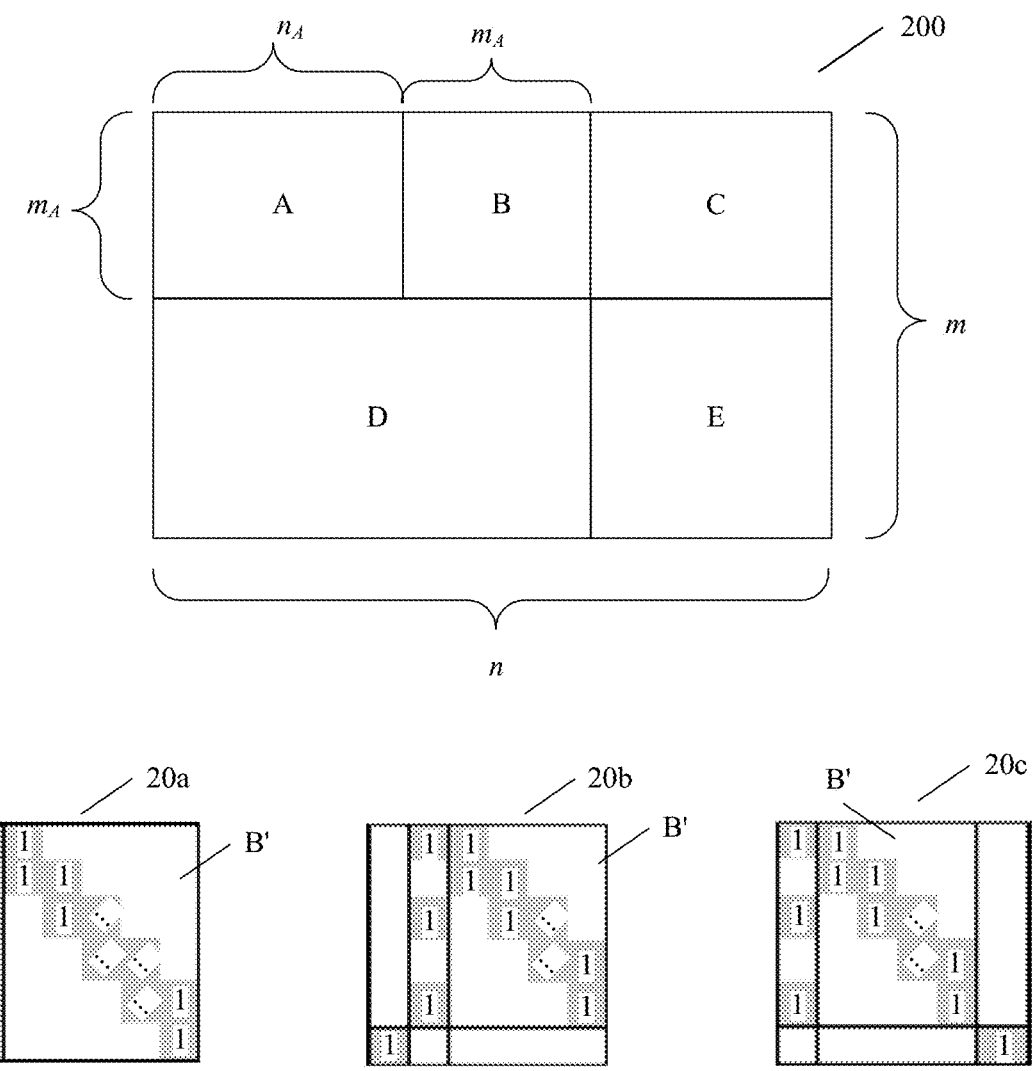
FIG. 2 is a schematic structural diagram of a base graph of an LDPC code.

For an LDPC code used in a wireless communications system, a matrix of a base graph of the LDPC code has a size of m rows and n columns, and may include five submatrices, namely, A, B, C, D, and E. A weight of the matrix is determined based on a quantity of non-zero entries. A weight of a row (a row weight) refers to a quantity of non-zero entries included in the row. A weight of a column (a column weight) refers to a quantity of non-zero entries included in the column. As shown in 200 in FIG. 2, A submatrix A is a matrix of $m_A$ rows and $n_A$ columns, and may have a size of $m_A*n_A$. Each column corresponds to Z system bits in the LDPC code. The system bits are sometimes also referred to as information bits.

A submatrix B is a square matrix of $m_A$ rows and $m_A$ columns, and may have a size of $m_A*m_A$. Each column corresponds to Z check bits in the LDPC code. The submatrix B includes a submatrix B' having a bidiagonal structure and a matrix column whose column weight is 3 (where the matrix column is briefly referred to as a weight-3 column). The matrix column whose column weight is 3 is located in front of the submatrix B', as shown in 20a in FIG. 2. The submatrix B may further include a matrix column whose column weight is 1 (where the matrix column is briefly referred to as a weight-1 column). The weight-1 column may be located in the first column or the last column of the submatrix B, and a non-zero entry in the weight-1 column is in the last row of the submatrix B, so that a row weight of the last row of the submatrix B is 1, as shown in 20b or 20c in FIG. 2.

Usually, a matrix generated based on the submatrices A and B is a core matrix, and the core matrix may be used to support high-code-rate encoding.

A submatrix C is an all-zero matrix and has a size of $m_A \times (n-(m_A+n_A))$.

A submatrix E is an identity matrix and has a size of $(m-m_A) \times (m-m_A)$.

A submatrix D has a size of $(m-m_A) \times (n_A+m_A)$, and may usually be used to generate parity bits for a low code rate.

Figure 3A:
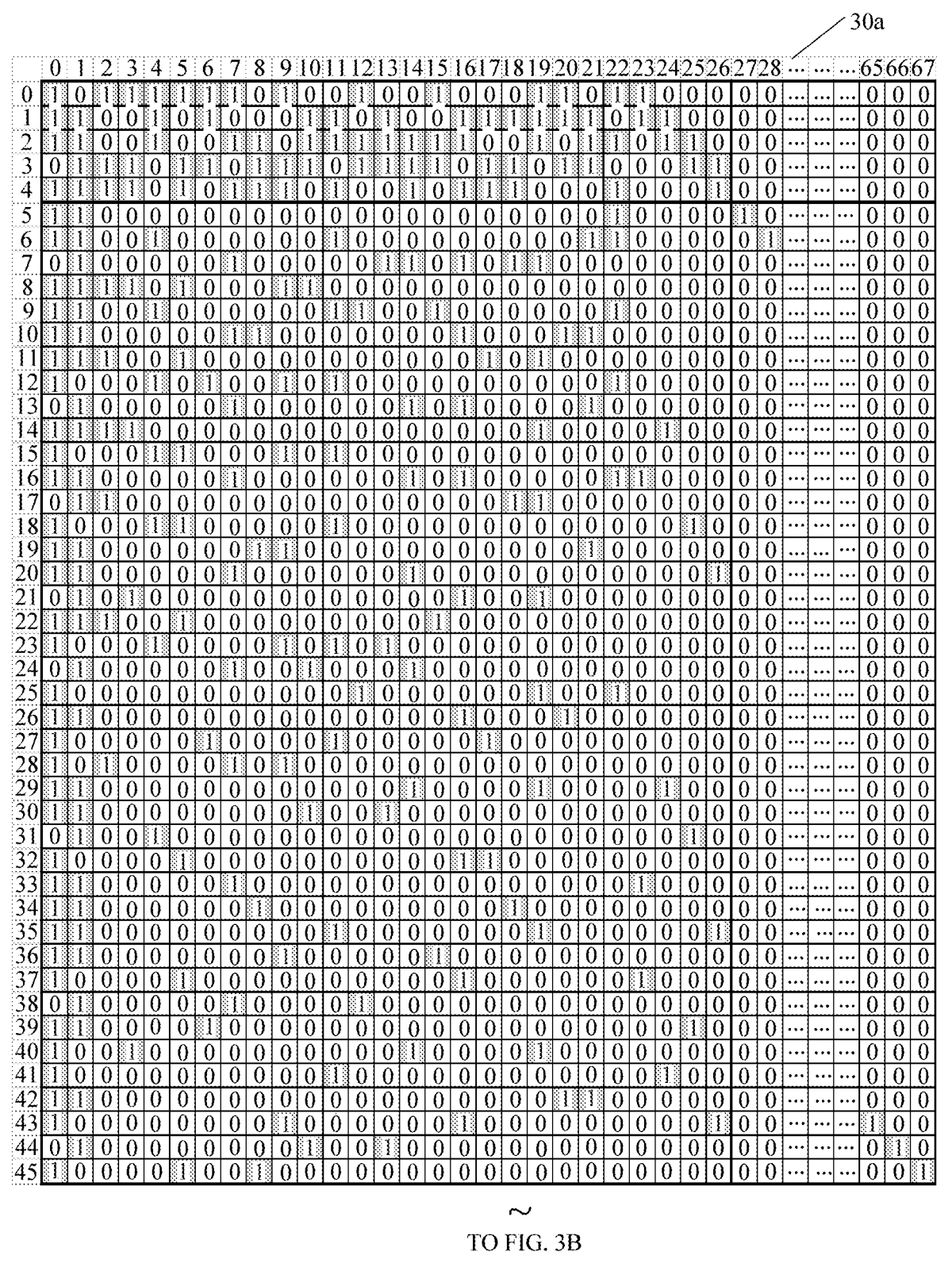
Figure 3B:
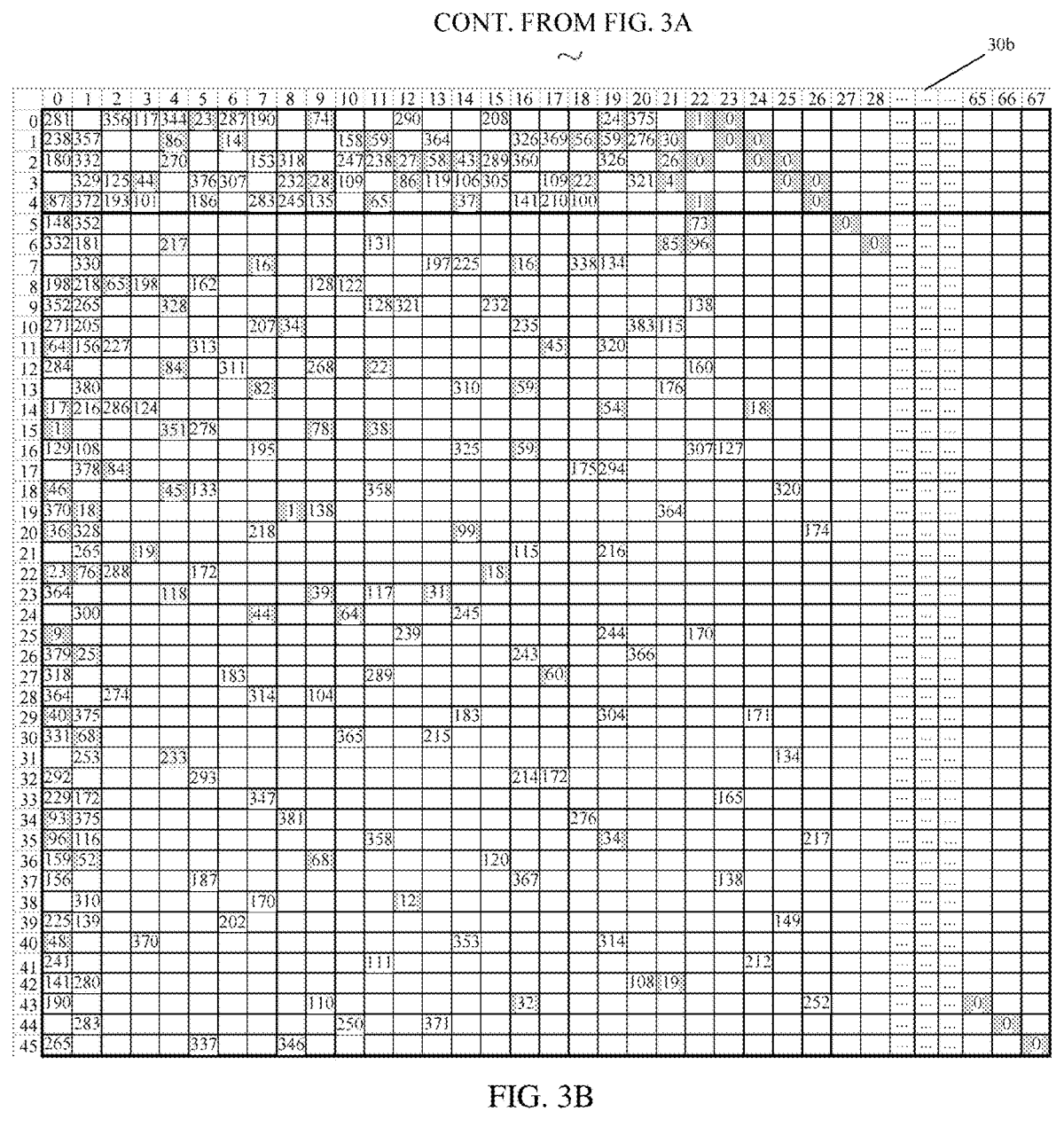
Figure 9:
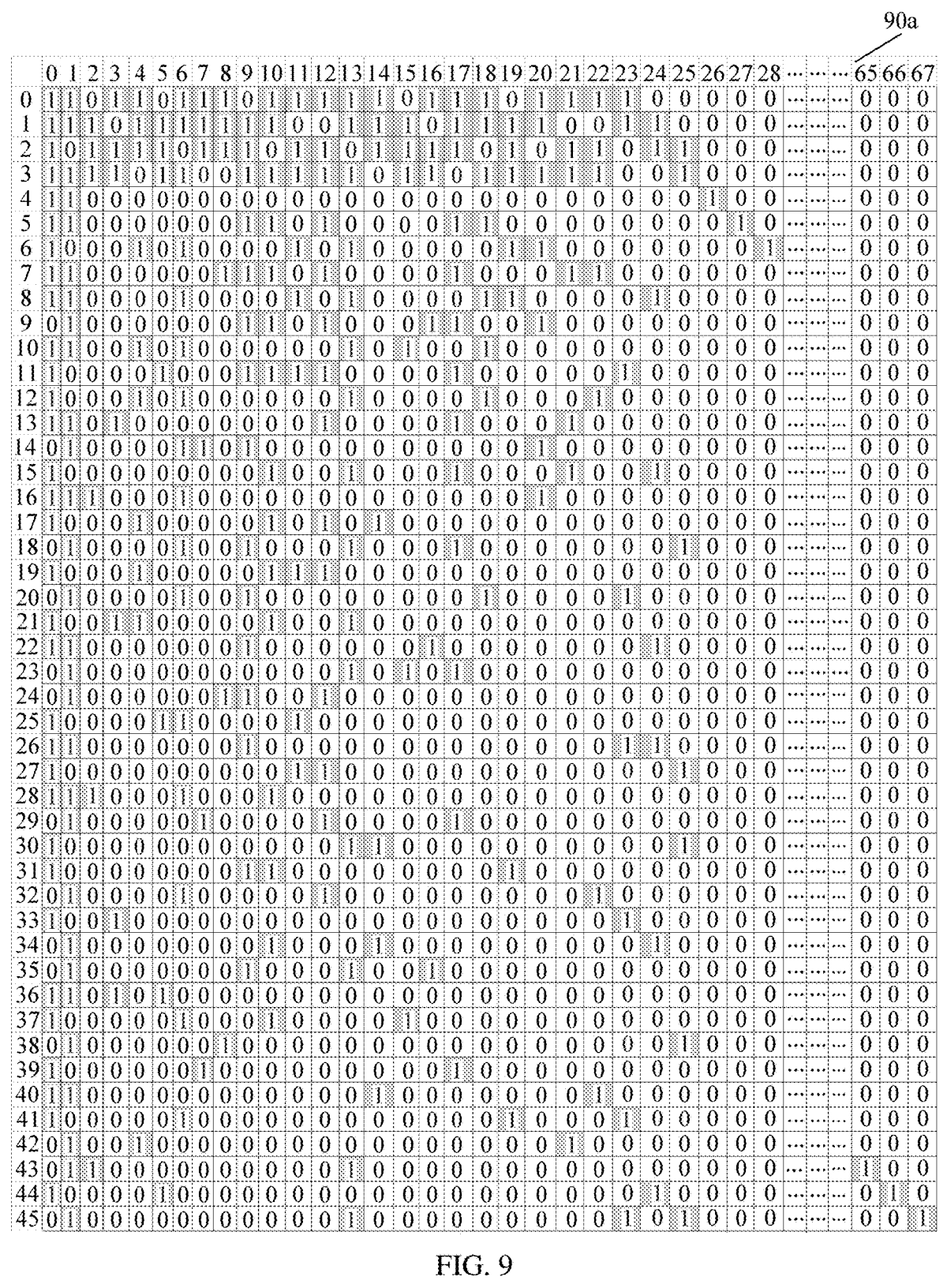
Figure 10:
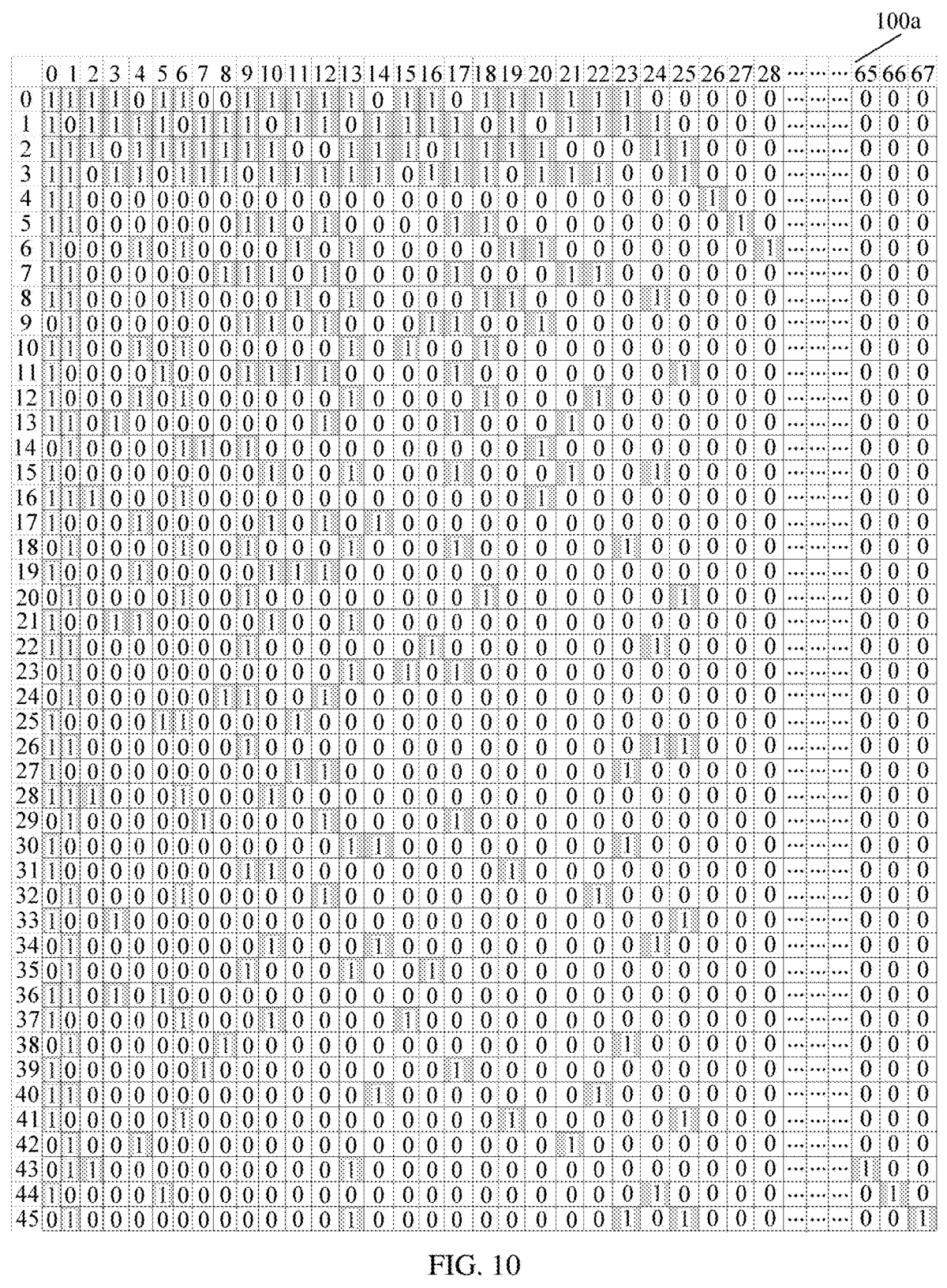

FIG. 3A and FIG. 3B show an example of a base graph 30a of an LDPC code and a corresponding base matrix 30b. The matrix has 46 rows and 68 columns. A submatrix A is a matrix part from row 0 to row 5 and from column 0 to column 21. A submatrix B is a matrix part from row 0 to row 5 and from column 22 to column 26. A matrix obtained based on the submatrix A and the submatrix B is a kernal matrix part of the base matrix. It should be noted that this is only an example herein. Another base graph or base matrix, for example, a base graph 90a shown in FIG. 9 or a base graph 100a in FIG. 10, may alternatively be used for the LDPC code. Details are not described herein one by one.

To obtain flexible code rates, a submatrix C, a submatrix D, and a submatrix E of corresponding sizes may be added based on the kernel matrix, to obtain different code rates. The submatrix C is an all-zero matrix and the submatrix E is an identity matrix, sizes of the matrices are mainly determined based on a code rate, and structures of the matrices are relatively fixed. The kernal matrix part and the submatrix D part mainly affect encoding performance and decoding performance. Different code rates may be obtained by forming the corresponding parts C, D, and E by adding rows and columns based on the core matrix.

A quantity of columns of the submatrix D is a sum of quantities of columns of the submatrices A and B. A quantity of rows of the submatrix D is mainly related to the code rate. The base graph 30a is used as an example. The quantity $n_D$ of the columns of the submatrix D is correspondingly: $(n_A+m_A)=27$. If a code rate supported by the LDPC code is $R_m$, a size of the base graph or the base matrix of the LDPC code is m*n, where $n=n_A/R_m+p$, and $m=n-n_A=n_A/R_m+p-n_A$. If a lowest code rate $Rm=⅓$, and a quantity of built-in puncture columns is p=2, using the base graph 30a as an example, n=68, m=46, and a quantity $m_D$ of rows of the submatrix D may be a maximum of: $m-m_A=46-5=41$, namely, $0≤m_D<41$.

The base matrix may include two built-in puncture bit columns. Therefore, after puncturing, a code rate that can be supported by the core matrix is 22/(27−2)=0.88. If a higher code rate needs to be obtained, parity bits further needs to be punctured; columns in the submatrices B, C, and E are punctured. For example, a matrix from row 0 to row 6 and column 0 to column 27 of the base graph 30a is used as an example. An input sequence is encoded based on an LDPC matrix obtained based on the matrix, to obtain a bit sequence D. Bits corresponding to built-in puncture columns are punctured, and bits corresponding to any two of the column 22 to the column 27 are punctured. Therefore, a code rate of the punctured bit sequence D is: 22/24=0.916. It should be noted that this is only an example herein. More parity check columns may further be punctured, to obtain a higher code rate. Details are not described herein again.

Figure 4:
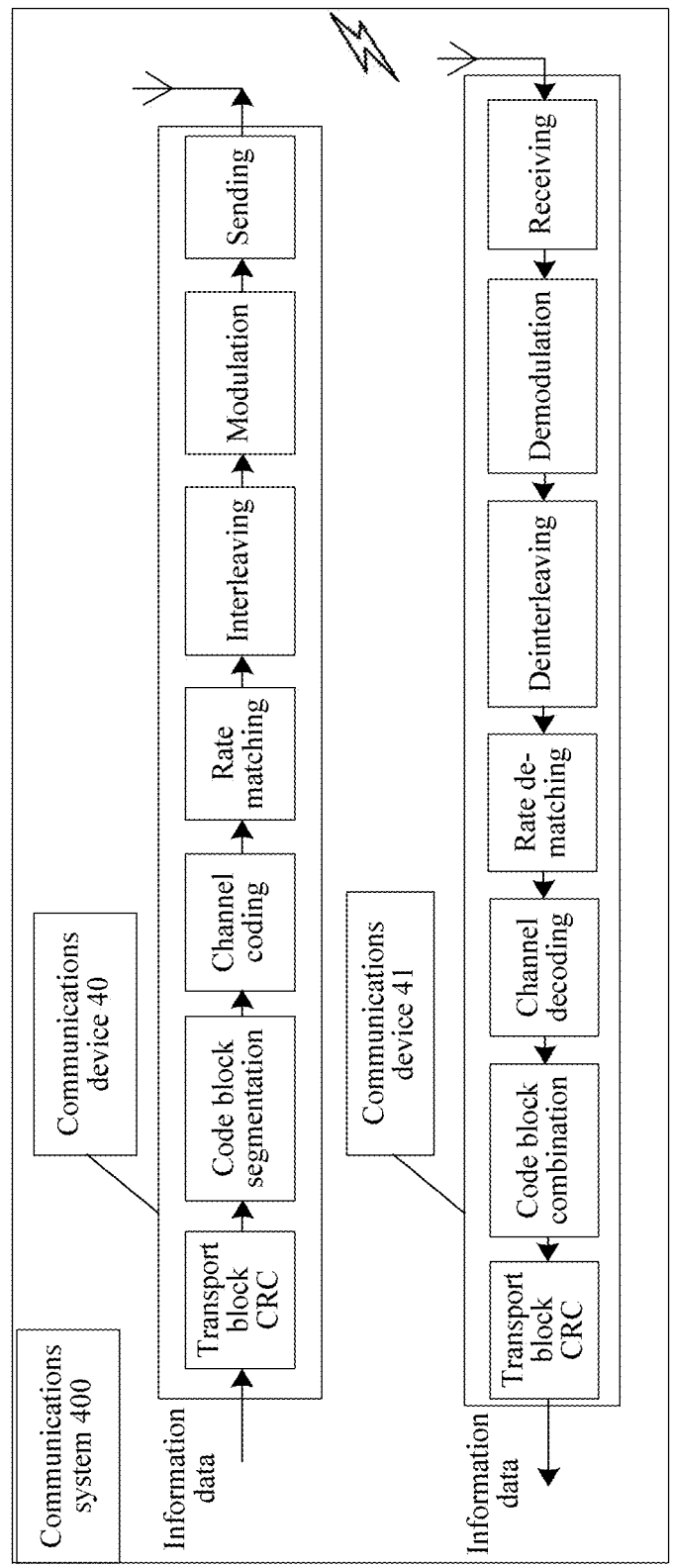
FIG. 4 is a schematic diagram of a communications system according to another embodiment of the present disclosure.

As shown in FIG. 4, a communications system 400 includes a communications device 40 and a communications device 41. Control information or data information, as an information sequence, is received and sent between the communications device 40 and the communications device 41. That the communications device 40 sends the information sequence is used as an example. A transport block CRC and code block segmentation are performed on the information sequence to obtain an input sequence C for channel coding. The channel coding is performed on the input sequence C to obtain a bit sequence D. Rate matching processing is performed on the bit sequence D to obtain an output bit sequence E. Further, the output bit sequence E are processed, for example, are interleaved and modulated, and sent. That the communications device 41 receives the information sequence is an inverse process of the foregoing process. In the rate matching process, puncturing and selection of the bit sequence D are determined based on a code rate, to obtain the output bit sequence. To ensure puncturing performance at a high code rate, a sequence of bits corresponding to a column in which a parity bit in the bit sequence D is located needs to adjusted and permuted. In an example, the communications device 40 may be a terminal, and the communications device 41 may correspondingly be a base station. In another example, the communications device 40 may be a base station, and the communications device 41 may correspondingly be a terminal.

Figure 5:
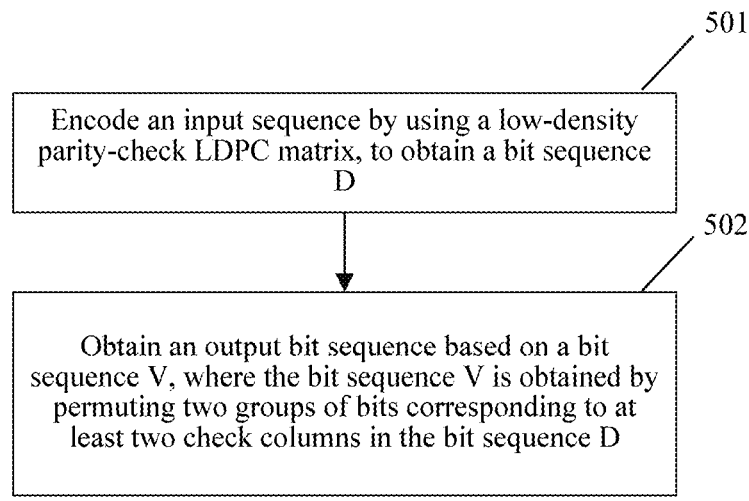
FIG. 5 is a flowchart of an information processing method according to another embodiment of the present disclosure.

FIG. 5 is a flowchart of an information processing method according to an embodiment of the present disclosure. The method includes the following operations.

501: Encode an input sequence by using an LDPC matrix, to obtain a bit sequence D.

A base graph of the LDPC matrix may be the matrix of m rows and n columns, for example, the base graph 30a, the base graph 90a, or the base graph 100a, in the foregoing example. Each column corresponds to a group of Z consecutive bits in the bit sequence D. n and Z are both integers greater than 0.

502: Obtain an output bit sequence based on a bit sequence V.

The bit sequence V is obtained by permuting two groups of bits corresponding to at least two parity check columns in the bit sequence D.

It may be learned from the foregoing example that, parity check columns may be column (n−m) to column (n−1) in a base matrix. For example, for the base graph 30a, the parity check columns may be the column 22 to the column 67.

After bits corresponding to built-in puncture columns are punctured, to further obtain a higher code rate, parity bits may further be punctured. Bits corresponding to a column that needs to be punctured needs to be permuted for puncturing processing.

At least two groups of bits in the bit sequence D that correspond to at least two of the column (n−m) to the column (n−1) in the base matrix may be permuted. Each group of bits includes Z consecutive bits. Column numbers of the base matrix start from 0.

The at least two parity check columns are the at least two of the column (n−m) to the column (n−1) in the base matrix. The column numbers of the base matrix start from 0. If the column numbers of the base matrix start from 1, the at least two parity check columns are correspondingly at least two of column (n−m+1) to column n in the base matrix. In this specification, unless particularly stated, row numbers and column numbers of a matrix all start from 0. If the row numbers and the column numbers of the matrix start from 1, the numbers are correspondingly increased by 1.

For example, for the base graph 30a, to obtain a bit sequence having a code rate of 0.916, two of six parity check columns from the column 22 to the column 27 may be punctured.

Through the permutation, a group j of Z consecutive bits in the bit sequence V is group P(j) of Z consecutive bits in the bit sequence D, where j is an integer, and $0≤j<n$.

In an implementation, a start group number of the six columns in the bit sequence V is a, and therefore $\{P(a+i)|0≤i<6\}=\{22, 23, 24, 25, 26, 27\}$.

Permuting at least two groups of bits corresponding to the at least two parity check columns in the bit sequence D to obtain the bit sequence V may be permuting at least two groups of Z consecutive bits in $\{P(a+i)|0≤i<6\}$ in the bit sequence D to obtain the bit sequence V.

Based on the descriptions of the foregoing example, the submatrix B usually has a bidiagonal structure. The several parity check columns have a bidiagonal structure. Puncturing is usually performed from the back to front. Therefore, s columns that need to be punctured may be permuted to the last s of the six columns, where s is an integer greater than 0. A sequence of other columns may be adjusted based on a requirement.

In an implementation, spaced puncturing may be performed. For example, the column 24 and the column 26 in the bit sequence D are permuted to the last two of the six columns in the bit sequence V. P(a+5)=26, P(a+4)=24, and Table 1 shows possible values of each group of {P(a+i) |0≤i<6}; or P(a+5)=24, P(a+4)=26, and Table 2 shows possible values of each group of {P(a+i)|0≤i<6}. Each column in the tables represents corresponding values of each entry in {P(a+i)|0≤i<6}. Each row is a group of possible values.

TABLE 1

| P(a) | P(a + 1) | P(a + 2) | P(a + 3) | P(a + 4) | P(a + 5) |
|---|---|---|---|---|---|
| 22 | 23 | 25 | 27 | 24 | 26 |
| 22 | 23 | 27 | 25 | 24 | 26 |
| 22 | 27 | 23 | 25 | 24 | 26 |
| 22 | 27 | 25 | 23 | 24 | 26 |
| 22 | 25 | 27 | 23 | 24 | 26 |
| 22 | 25 | 23 | 27 | 24 | 26 |
| 23 | 22 | 25 | 27 | 24 | 26 |
| 23 | 22 | 27 | 25 | 24 | 26 |
| 23 | 25 | 22 | 27 | 24 | 26 |
| 23 | 25 | 27 | 22 | 24 | 26 |
| 23 | 27 | 25 | 22 | 24 | 26 |
| 23 | 27 | 22 | 25 | 24 | 26 |
| 27 | 22 | 23 | 25 | 24 | 26 |
| 27 | 22 | 25 | 23 | 24 | 26 |
| 27 | 23 | 22 | 25 | 24 | 26 |
| 27 | 23 | 25 | 22 | 24 | 26 |
| 27 | 25 | 22 | 23 | 24 | 26 |
| 27 | 25 | 23 | 22 | 24 | 26 |
| 25 | 22 | 23 | 27 | 24 | 26 |
| 25 | 22 | 27 | 23 | 24 | 26 |
| 25 | 23 | 22 | 27 | 24 | 26 |
| 25 | 23 | 27 | 22 | 24 | 26 |
| 25 | 27 | 22 | 23 | 24 | 26 |
| 25 | 27 | 23 | 22 | 24 | 26 |

TABLE 2

| P(a) | P(a + 1) | P(a + 2) | P(a + 3) | P(a + 4) | P(a + 5) |
|---|---|---|---|---|---|
| 22 | 23 | 25 | 27 | 26 | 24 |
| 22 | 23 | 27 | 25 | 26 | 24 |
| 22 | 27 | 23 | 25 | 26 | 24 |
| 22 | 27 | 25 | 23 | 26 | 24 |
| 22 | 25 | 27 | 23 | 26 | 24 |
| 22 | 25 | 23 | 27 | 26 | 24 |
| 23 | 22 | 25 | 27 | 26 | 24 |
| 23 | 22 | 27 | 25 | 26 | 24 |
| 23 | 25 | 22 | 27 | 26 | 24 |
| 23 | 25 | 27 | 22 | 26 | 24 |
| 23 | 27 | 25 | 22 | 26 | 24 |
| 23 | 27 | 22 | 25 | 26 | 24 |
| 27 | 22 | 23 | 25 | 26 | 24 |
| 27 | 22 | 25 | 23 | 26 | 24 |
| 27 | 23 | 22 | 25 | 26 | 24 |
| 27 | 23 | 25 | 22 | 26 | 24 |
| 27 | 25 | 22 | 23 | 26 | 24 |
| 27 | 25 | 23 | 22 | 26 | 24 |
| 25 | 22 | 23 | 27 | 26 | 24 |
| 25 | 22 | 27 | 23 | 26 | 24 |
| 25 | 23 | 22 | 27 | 26 | 24 |
| 25 | 23 | 27 | 22 | 26 | 24 |

TABLE 2-continued

| P(a) | P(a + 1) | P(a + 2) | P(a + 3) | P(a + 4) | P(a + 5) |
|---|---|---|---|---|---|
| 25 | 27 | 22 | 23 | 26 | 24 |
| 25 | 27 | 23 | 22 | 26 | 24 |

In another implementation, columns in the bidiagonal structure may be permuted. For example, the column 25 and the column 26 in the bit sequence D may be permuted to the last two of the six columns in the bit sequence V. P(a+5)=26, P(a+4)=25, and Table 3 shows possible values of {P(a+i) |0≤i<6}; or P(a+5)=25, P(a+4)=26, and Table 4 shows possible values of {P(a+i)|0≤i<6}. For another example, the column 24 and the column 25 in the bit sequence D may alternatively be permuted to the last two of the six columns in the bit sequence V. P(a+5)=25, P(a+4)=24, and Table 5 shows possible values of {P(a+i)|0≤i<6}; or P(a+5)=24, P(a+4)=25, and Table 6 shows possible values of {P(a+i) |0≤i<6}. For another example, the column 23 and the column 24 in the bit sequence D may alternatively be permuted to the last two of the six columns in the bit sequence V. P(a+5)=24, P(a+4)=23, and Table 7 shows possible values of {P(a+i)|0≤i<6}; or P(a+5)=23, P(a+4)=24, and Table 8 shows possible values of {P(a+i) |0≤i<6}.

Each column in the tables represents corresponding values of each entry in {P(a+i)|0≤i<6}. Each row is a group of possible values.

TABLE 3

| P (a) | P (a + 1) | P (a + 2) | P (a + 3) | P (a + 4) | P (a + 5) |
|---|---|---|---|---|---|
| 22 | 23 | 24 | 27 | 25 | 26 |
| 22 | 23 | 27 | 24 | 25 | 26 |
| 22 | 24 | 23 | 27 | 25 | 26 |
| 22 | 24 | 27 | 23 | 25 | 26 |
| 22 | 27 | 23 | 24 | 25 | 26 |
| 22 | 27 | 24 | 23 | 25 | 26 |
| 23 | 22 | 24 | 27 | 25 | 26 |
| 23 | 22 | 27 | 24 | 25 | 26 |
| 23 | 24 | 22 | 27 | 25 | 26 |
| 23 | 24 | 27 | 22 | 25 | 26 |
| 23 | 27 | 22 | 24 | 25 | 26 |
| 23 | 27 | 24 | 22 | 25 | 26 |
| 24 | 22 | 23 | 27 | 25 | 26 |
| 24 | 22 | 27 | 23 | 25 | 26 |
| 24 | 23 | 22 | 27 | 25 | 26 |
| 24 | 23 | 27 | 22 | 25 | 26 |
| 24 | 27 | 22 | 23 | 25 | 26 |
| 24 | 27 | 23 | 22 | 25 | 26 |
| 27 | 22 | 23 | 24 | 25 | 26 |
| 27 | 22 | 24 | 23 | 25 | 26 |
| 27 | 23 | 22 | 24 | 25 | 26 |
| 27 | 23 | 24 | 22 | 25 | 26 |
| 27 | 24 | 22 | 23 | 25 | 26 |
| 27 | 24 | 23 | 22 | 25 | 26 |

TABLE 4

| P (a) | P (a + 1) | P (a + 2) | P (a + 3) | P (a + 4) | P (a + 5) |
|---|---|---|---|---|---|
| 22 | 23 | 24 | 27 | 26 | 25 |
| 22 | 23 | 27 | 24 | 26 | 25 |
| 22 | 24 | 23 | 27 | 26 | 25 |
| 22 | 24 | 27 | 23 | 26 | 25 |
| 22 | 27 | 23 | 24 | 26 | 25 |
| 22 | 27 | 24 | 23 | 26 | 25 |
| 23 | 22 | 24 | 27 | 26 | 25 |
| 23 | 22 | 27 | 24 | 26 | 25 |
| 23 | 24 | 22 | 27 | 26 | 25 |
| 23 | 24 | 27 | 22 | 26 | 25 |
| 23 | 27 | 22 | 24 | 26 | 25 |

TABLE 4-continued

| P(a) | P(a + 1) | P(a + 2) | P(a + 3) | P(a + 4) | P(a + 5) |
|---|---|---|---|---|---|
| 23 | 27 | 24 | 22 | 26 | 25 |
| 24 | 22 | 23 | 27 | 26 | 25 |
| 24 | 22 | 27 | 23 | 26 | 25 |
| 24 | 23 | 22 | 27 | 26 | 25 |
| 24 | 23 | 27 | 22 | 26 | 25 |
| 24 | 27 | 22 | 23 | 26 | 25 |
| 24 | 27 | 23 | 22 | 26 | 25 |
| 27 | 22 | 23 | 24 | 26 | 25 |
| 27 | 22 | 24 | 23 | 26 | 25 |
| 27 | 23 | 22 | 24 | 26 | 25 |
| 27 | 23 | 24 | 22 | 26 | 25 |
| 27 | 24 | 22 | 23 | 26 | 25 |
| 27 | 24 | 23 | 22 | 26 | 25 |

TABLE 5

| P(a) | P(a + 1) | P(a + 2) | P(a + 3) | P(a + 4) | P(a + 5) |
|---|---|---|---|---|---|
| 22 | 23 | 26 | 27 | 24 | 25 |
| 22 | 23 | 27 | 26 | 24 | 25 |
| 22 | 26 | 23 | 27 | 24 | 25 |
| 22 | 26 | 27 | 23 | 24 | 25 |
| 22 | 27 | 23 | 26 | 24 | 25 |
| 22 | 27 | 26 | 23 | 24 | 25 |
| 23 | 22 | 26 | 27 | 24 | 25 |
| 23 | 22 | 27 | 26 | 24 | 25 |
| 23 | 26 | 22 | 27 | 24 | 25 |
| 23 | 26 | 27 | 22 | 24 | 25 |
| 23 | 27 | 22 | 26 | 24 | 25 |
| 23 | 27 | 26 | 22 | 24 | 25 |
| 26 | 22 | 23 | 27 | 24 | 25 |
| 26 | 22 | 27 | 23 | 24 | 25 |
| 26 | 23 | 22 | 27 | 24 | 25 |
| 26 | 23 | 27 | 22 | 24 | 25 |
| 26 | 27 | 22 | 23 | 24 | 25 |
| 26 | 27 | 23 | 22 | 24 | 25 |
| 27 | 22 | 23 | 26 | 24 | 25 |
| 27 | 22 | 26 | 23 | 24 | 25 |
| 27 | 23 | 22 | 26 | 24 | 25 |
| 27 | 23 | 26 | 22 | 24 | 25 |
| 27 | 26 | 22 | 23 | 24 | 25 |
| 27 | 26 | 23 | 22 | 24 | 25 |

TABLE 6

| P(a) | P(a + 1) | P(a + 2) | P(a + 3) | P(a + 4) | P(a + 5) |
|---|---|---|---|---|---|
| 22 | 23 | 26 | 27 | 25 | 24 |
| 22 | 23 | 27 | 26 | 25 | 24 |
| 22 | 26 | 23 | 27 | 25 | 24 |
| 22 | 26 | 27 | 23 | 25 | 24 |
| 22 | 27 | 23 | 26 | 25 | 24 |
| 22 | 27 | 26 | 23 | 25 | 24 |
| 23 | 22 | 26 | 27 | 25 | 24 |
| 23 | 22 | 27 | 26 | 25 | 24 |
| 23 | 26 | 22 | 27 | 25 | 24 |
| 23 | 26 | 27 | 22 | 25 | 24 |
| 23 | 27 | 22 | 26 | 25 | 24 |
| 23 | 27 | 26 | 22 | 25 | 24 |
| 26 | 22 | 23 | 27 | 25 | 24 |
| 26 | 22 | 27 | 23 | 25 | 24 |
| 26 | 23 | 22 | 27 | 25 | 24 |
| 26 | 23 | 27 | 22 | 25 | 24 |
| 26 | 27 | 22 | 23 | 25 | 24 |
| 26 | 27 | 23 | 22 | 25 | 24 |
| 27 | 22 | 23 | 26 | 25 | 24 |
| 27 | 22 | 26 | 23 | 25 | 24 |
| 27 | 23 | 22 | 26 | 25 | 24 |
| 27 | 23 | 26 | 22 | 25 | 24 |
| 27 | 26 | 22 | 23 | 25 | 24 |
| 27 | 26 | 23 | 22 | 25 | 24 |

TABLE 7

| P(a) | P(a + 1) | P(a + 2) | P(a + 3) | P(a + 4) | P(a + 5) |
|---|---|---|---|---|---|
| 22 | 25 | 26 | 27 | 23 | 24 |
| 22 | 25 | 27 | 26 | 23 | 24 |
| 22 | 26 | 25 | 27 | 23 | 24 |
| 22 | 26 | 27 | 25 | 23 | 24 |
| 22 | 27 | 25 | 26 | 23 | 24 |
| 22 | 27 | 26 | 25 | 23 | 24 |
| 25 | 22 | 26 | 27 | 23 | 24 |
| 25 | 22 | 27 | 26 | 23 | 24 |
| 25 | 26 | 22 | 27 | 23 | 24 |
| 25 | 26 | 27 | 22 | 23 | 24 |
| 25 | 27 | 22 | 26 | 23 | 24 |
| 25 | 27 | 26 | 22 | 23 | 24 |
| 26 | 22 | 25 | 27 | 23 | 24 |
| 26 | 22 | 27 | 25 | 23 | 24 |
| 26 | 25 | 22 | 27 | 23 | 24 |
| 26 | 25 | 27 | 22 | 23 | 24 |
| 26 | 27 | 22 | 25 | 23 | 24 |
| 26 | 27 | 25 | 22 | 23 | 24 |
| 27 | 22 | 25 | 26 | 23 | 24 |
| 27 | 22 | 26 | 25 | 23 | 24 |
| 27 | 25 | 22 | 26 | 23 | 24 |
| 27 | 25 | 26 | 22 | 23 | 24 |
| 27 | 26 | 22 | 25 | 23 | 24 |
| 27 | 26 | 25 | 22 | 23 | 24 |

TABLE 8

| P(a) | P(a + 1) | P(a + 2) | P(a + 3) | P(a + 4) | P(a + 5) |
|---|---|---|---|---|---|
| 22 | 25 | 26 | 27 | 24 | 23 |
| 22 | 25 | 27 | 26 | 24 | 23 |
| 22 | 26 | 25 | 27 | 24 | 23 |
| 22 | 26 | 27 | 25 | 24 | 23 |
| 22 | 27 | 25 | 26 | 24 | 23 |
| 22 | 27 | 26 | 25 | 24 | 23 |
| 25 | 22 | 26 | 27 | 24 | 23 |
| 25 | 22 | 27 | 26 | 24 | 23 |
| 25 | 26 | 22 | 27 | 24 | 23 |
| 25 | 26 | 27 | 22 | 24 | 23 |
| 25 | 27 | 22 | 26 | 24 | 23 |
| 25 | 27 | 26 | 22 | 24 | 23 |
| 26 | 22 | 25 | 27 | 24 | 23 |
| 26 | 22 | 27 | 25 | 24 | 23 |
| 26 | 25 | 22 | 27 | 24 | 23 |
| 26 | 25 | 27 | 22 | 24 | 23 |
| 26 | 27 | 22 | 25 | 24 | 23 |
| 26 | 27 | 25 | 22 | 24 | 23 |
| 27 | 22 | 25 | 26 | 24 | 23 |
| 27 | 22 | 26 | 25 | 24 | 23 |
| 27 | 25 | 22 | 26 | 24 | 23 |
| 27 | 25 | 26 | 22 | 24 | 23 |
| 27 | 26 | 22 | 25 | 24 | 23 |
| 27 | 26 | 25 | 22 | 24 | 23 |

There are usually two built-in puncture columns, for example, the column 0 and the column 1. In an implementation, two groups of bits corresponding to the built-in puncture columns in the bit sequence D may be permuted to the last two groups of the bit sequence V. Therefore, a possible permutation sequence is shown in Table 9, illustrating groups of bits in the bit sequence V that correspond to P(j) groups of bits in the bit sequence D from left to right and from top to right. For example, the group 0 of bits in the bit sequence V is the group 2 of bits in the bit sequence D, and the group 1 of bits is the group 3 of bits in the bit sequence D. The rest can be deduced by analogy, and details are not described one by one. The group 20 of bits is P(a) in the bit sequence, namely, a=20. The group 65 of bits is the group 67 of bits in the bit sequence D. The group 0 of bits and the first group of bits in the bit sequence D are placed in locations of the group 66 and the group 67 of bits in the bit sequence V. {P(a+i)|0≤i<6} may be any group of possible values in Table 1 to Table 8.

In the foregoing implementation, if the permutation sequence shown in Table 11 is used, during initial transmis-

TABLE 9

| Permutation sequence of P(j), where 0 ≤ j < n | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|
| | 19 | 20 | 21 | P(a) | P(a + 1) | P(a + 2) | P(a + 3) | P(a + 4) | P(a + 5) | 28 | 29 | 30 | 31 | 32 | 33 | 34 | 35 |
| | 36 | 37 | 38 | 39 | 40 | 41 | 42 | 43 | 44 | 45 | 46 | 47 | 48 | 49 | 50 | 51 | 52 |
| | 53 | 54 | 55 | 56 | 57 | 58 | 59 | 60 | 61 | 62 | 63 | 64 | 65 | 66 | 67 | 0 | 1 |

In the foregoing implementation, if the permutation sequence shown in Table 9 is used, during initial transmission, the bit 0 of the bit sequence V may be used as a start location to obtain an output bit sequence E. In this manner, during retransmission, the two groups of bits corresponding to the built-in puncture columns may still be obtained.

In another implementation, the two groups of bits corresponding to the built-in puncture columns in the bit sequence D are not permuted. A possible permutation sequence is shown in Table 10, illustrating groups of bits in the bit sequence V that correspond to P(j) groups of bits in the bit sequence D from left to right and from top to right. For example, the group 0 of bits in the bit sequence V is the group 0 of bits in the bit sequence D, and the group 1 of bits is the group 1 of bits in the bit sequence D. The rest can be deduced by analogy, and details are not described one by one. The group 22 of bits is P(a) in the bit sequence, namely, a=22. The group 67 of bits is the group 67 of bits in the bit sequence D. {P(a+i)|0≤i<6} may be any group of possible values in Table 1 to Table 8.

sion, the bit 0 of the bit sequence V may be used as a start location to obtain an output bit sequence E. Because the two groups of bits corresponding to the built-in puncture columns are discarded, regardless of the initial transmission or retransmission, the output bit sequence does not include the two groups of bits corresponding to the built-in puncture columns, namely, the group 0 of bits and the group 1 of bits in the bit sequence D.

In another implementation, using the base graph 90a as an example, to obtain a bit sequence having a code rate of $22/23$, two of five parity check columns from the column 22 to the column 26 may be punctured.

Through the permutation, group j of Z consecutive bits in the bit sequence V is group P(j) of Z consecutive bits in the bit sequence D, where j is an integer, and 0≤j<n.

A start group number of the five parity check columns in the bit sequence V is a, and therefore {P(a+k)|0≤k<5}={22, 23, 24, 25, 26}.

Permuting at least two groups of bits corresponding to the at least two parity check columns in the bit sequence D to

TABLE 10

| Permutation sequence of P(j), where 0 ≤ j < n | 0 | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|---|
| | 17 | 18 | 19 | 20 | 21 | P(a) | P(a + 1) | P(a + 2) | P(a + 3) | P(a + 4) | P(a + 5) | 28 | 29 | 30 | 31 | 32 | 33 |
| | 34 | 35 | 36 | 37 | 38 | 39 | 40 | 41 | 42 | 43 | 44 | 45 | 46 | 47 | 48 | 49 | 50 |
| | 51 | 52 | 53 | 54 | 55 | 56 | 57 | 58 | 59 | 60 | 61 | 62 | 63 | 64 | 65 | 66 | 67 |

In the foregoing implementation, if the permutation sequence shown in Table 10 is used, during initial transmission, bit (2*Z) of the bit sequence V may be used as a start location to obtain an output bit sequence E; the group 0 of bits and the group 1 of bits are skipped. In this manner, during retransmission, the two groups of bits corresponding to the built-in puncture columns may still be obtained.

In another implementation, the two groups of bits corresponding to the built-in puncture columns in the bit sequence D are directly discarded. Therefore, a permutation sequence is shown in Table 11, illustrating groups of bits in the bit sequence V that correspond to P(j) groups of bits in the bit sequence D from left to right and from top to right. For example, the group 0 of bits in the bit sequence V is the group 2 of bits in the bit sequence D, and the group 1 of bits is the group 3 of bits in the bit sequence D. The rest can be deduced by analogy, and details are not described one by one. The group 20 of bits is P(a) in the bit sequence, namely, a=20. The group 65 of bits is the group 67 of bits in the bit sequence D. {P(a+i)|0≤i<6} may be any group of possible values in Table 1 to Table 8.

obtain the bit sequence V may be permuting at least two groups of Z consecutive bits in {P(a+k)|0≤k<5} in the bit sequence D to obtain the bit sequence V.

Based on the descriptions of the foregoing example, the submatrix B usually has a bidiagonal structure. The several parity check columns have a bidiagonal structure. Puncturing is usually performed from the back to front. Therefore, s columns that need to be punctured may be permuted to the last s of the five columns, where s is an integer greater than 0. A sequence of other columns may be adjusted based on a requirement.

For example, the column 23 and the column 26 in the bit sequence D may be permuted to the last two of the five columns in the bit sequence V. P(a+4)=23, P(a+3)=26, and Table 12 shows groups of possible values of {P(a+k)|0≤k<5}; or P(a+4)=26, P(a+3)=23, and Table 13 shows groups of possible values of {P(a+k)|0≤k<5}. Each column in the tables represents corresponding values of each entry in {P(a+k)|0≤k<5}. Each row is a group of possible values.

TABLE 11

| Permutation sequence of P(j), where 0 ≤ j < n | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|
| | 19 | 20 | 21 | P(a) | P(a + 1) | P(a + 2) | P(a + 3) | P(a + 4) | P(a + 5) | 28 | 29 | 30 | 31 | 32 | 33 | 34 | 35 |
| | 36 | 37 | 38 | 39 | 40 | 41 | 42 | 43 | 44 | 45 | 46 | 47 | 48 | 49 | 50 | 51 | 52 |
| | 53 | 54 | 55 | 56 | 57 | 58 | 59 | 60 | 61 | 62 | 63 | 64 | 65 | 66 | 67 | | |

TABLE 12

| P(a) | P(a + 1) | P(a + 2) | P(a + 3) | P(a + 4) |
|------|----------|----------|----------|----------|
| 22 | 24 | 25 | 26 | 23 |
| 22 | 25 | 24 | 26 | 23 |
| 24 | 22 | 25 | 26 | 23 |
| 24 | 25 | 22 | 26 | 23 |
| 25 | 22 | 24 | 26 | 23 |
| 25 | 24 | 22 | 26 | 23 |

TABLE 13

| P(a) | P(a + 1) | P(a + 2) | P(a + 3) | P(a + 4) |
|------|----------|----------|----------|----------|
| 22 | 24 | 25 | 23 | 26 |
| 22 | 25 | 24 | 23 | 26 |
| 24 | 22 | 25 | 23 | 26 |
| 24 | 25 | 22 | 23 | 26 |
| 25 | 22 | 24 | 23 | 26 |
| 25 | 24 | 22 | 23 | 26 |

In another implementation, using the base graph 100a as an example, to obtain a bit sequence having a code rate of 22/23, two of five parity check columns from the column 22 to the column 26 may be punctured.

Through the permutation, group j of Z consecutive bits in the bit sequence V is group P(j) of Z consecutive bits in the bit sequence D, where j is an integer, and 0≤j<n.

A start group number of the five parity check columns in the bit sequence V is a, and therefore {P(a+k)|0≤k<5}={22, 23, 24, 25, 26}.

Permuting at least two groups of bits corresponding to the at least two parity check columns in the bit sequence D to obtain the bit sequence V may be permuting at least two groups of Z consecutive bits in {P(a+k)|0≤k<5} in the bit sequence D to obtain the bit sequence V.

Based on the descriptions of the foregoing example, the submatrix B usually has a bidiagonal structure. The several parity check columns have a bidiagonal structure. Puncturing is usually performed from the back to front. Therefore, s columns that need to be punctured may be permuted to the last s of the five columns, where s is an integer greater than 0. A sequence of other columns may be adjusted based on a requirement.

For example, the column 25 and the column 26 in the bit sequence D may be permuted to the last two of the five columns in the bit sequence V. P(a+4)=25, P(a+3)=26, and Table 13 shows groups of possible values of {P(a+k)|0≤k<5}; or P(a+4)=26, P(a+3)=25, and Table 14 shows groups of possible values of {P(a+k)|0≤k<5}. Each column in the tables represents corresponding values of each entry in {P(a+k)|0≤k<5}. Each row is a group of possible values.

TABLE 14

| P(a) | P(a + 1) | P(a + 2) | P(a + 3) | P(a + 4) |
|------|----------|----------|----------|----------|
| 22 | 23 | 24 | 25 | 26 |
| 22 | 24 | 23 | 25 | 26 |
| 23 | 22 | 24 | 25 | 26 |

TABLE 14-continued

| P(a) | P(a + 1) | P(a + 2) | P(a + 3) | P(a + 4) |
|------|----------|----------|----------|----------|
| 23 | 24 | 22 | 25 | 26 |
| 24 | 22 | 23 | 25 | 26 |
| 24 | 23 | 22 | 25 | 26 |

TABLE 15

| P (a) | P (a + 1) | P (a + 2) | P (a + 3) | P (a + 4) |
|-------|-----------|-----------|-----------|-----------|
| 22 | 23 | 24 | 26 | 25 |
| 22 | 24 | 23 | 26 | 25 |
| 23 | 22 | 24 | 26 | 25 |
| 23 | 24 | 22 | 26 | 25 |
| 24 | 22 | 23 | 26 | 25 |
| 24 | 23 | 22 | 26 | 25 |

There are usually two built-in puncture columns, for example, the column 0 and the column 1. In an implementation, two groups of bits corresponding to the built-in puncture columns in the bit sequence D may be permuted to the last two groups of the bit sequence V. Therefore, a possible permutation sequence is shown in Table 16, illustrating groups of bits in the bit sequence V that correspond to P(j) groups of bits in the bit sequence D from left to right and from top to right. For example, the group 0 of bits in the bit sequence V is the group 2 of bits in the bit sequence D, and the group 1 of bits is the group 3 of bits in the bit sequence D. The rest can be deduced by analogy, and details are not described one by one. The group 20 of bits is P(a) the bit sequence, namely, a=20. The group 65 of bits is the group 67 of bits in the bit sequence D. The group 0 of bits and the group 1 of bits in the bit sequence D are placed in locations of the group 66 and the group 67 of bits in the bit sequence V. {P(a+k)|1≤k<5} may be any group of possible values in Table 12 to Table 15.

TABLE 16

| Permutation sequence of P(j), where 0 ≤ j < n | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|
| | 19 | 20 | 21 | P(a) | P(a + 1) | P(a + 2) | P(a + 3) | P(a + 4) | 27 | 28 | 29 | 30 | 31 | 32 | 33 | 34 | 35 |
| | 36 | 37 | 38 | 39 | 40 | 41 | 42 | 43 | 44 | 45 | 46 | 47 | 48 | 49 | 50 | 51 | 52 |
| | 53 | 54 | 55 | 56 | 57 | 58 | 59 | 60 | 61 | 62 | 63 | 64 | 65 | 66 | 67 | 0 | 1 |

In the foregoing implementation, if the permutation sequence shown in Table 16 is used, during initial transmission, the bit 0 of the bit sequence V may be used as a start location to obtain an output bit sequence E. In this manner, during retransmission, the two groups of bits corresponding to the built-in puncture columns may still be obtained.

In another implementation, the two groups of bits corresponding to the built-in puncture columns in the bit sequence D are not permuted. A possible permutation sequence is shown in Table 17, illustrating groups of bits in the bit sequence V that correspond to P(j) groups of bits in the bit sequence D from left to right and from top to right. For example, the group 0 of bits in the bit sequence V is the group 0 of bits in the bit sequence D, and the group 1 of bits is the group 1 of bits in the bit sequence D. The rest can be deduced by analogy, and details are not described one by one. The group 22 of bits is P(a) in the bit sequence, namely, a=22. The group 67 of bits is the group 67 of bits in the bit sequence D. {P(a+k)|0≤k<5} may be any group of possible values in Table 12 to Table 15.

to-be-punctured parity check column is permuted by using the LDPC matrix of the base graph 30a according to the

TABLE 17

| Permutation sequence of P(j), where 0 ≤ j < n | 0 | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|---|
| | 17 | 18 | 19 | 20 | 21 | P(a) | P(a + 1) | P(a + 2) | P(a + 3) | P(a + 4) | 27 | 28 | 29 | 30 | 31 | 32 | 33 |
| | 34 | 35 | 36 | 37 | 38 | 39 | 40 | 41 | 42 | 43 | 44 | 45 | 46 | 47 | 48 | 49 | 50 |
| | 51 | 52 | 53 | 54 | 55 | 56 | 57 | 58 | 59 | 60 | 61 | 62 | 63 | 64 | 65 | 66 | 67 |

In the foregoing implementation, if the permutation sequence shown in Table 17 is used, during initial transmission, bit (2*Z) of the bit sequence V may be used as a start location to obtain an output bit sequence E; the group 0 of bits and the group 1 of bits are skipped. In this manner, during retransmission, the two groups of bits corresponding to the built-in puncture columns may still be obtained.

In another implementation, the two groups of bits corresponding to the built-in puncture columns in the bit sequence D are directly discarded. Therefore, a permutation sequence is shown in Table 18, illustrating groups of bits in the bit sequence V that correspond to P(j) groups of bits in the bit sequence D from left to right and from top to right. For example, the group 0 of bits in the bit sequence V is the group 2 of bits in the bit sequence D, and the group 1 of bits is the group 3 of bits in the bit sequence D. The rest can be deduced by analogy, and details are not described one by one. The group 20 of bits is P(a) in the bit sequence, namely, a=20. The group 65 of bits is the group 67 of bits in the bit sequence D. {P(a+k)|0≤k<5} may be any group of possible values in Table 12 to Table 15.

information processing method provided in this embodiment of the present disclosure. It may be learned that at a same Es/N0, the BLER decreases, and performance is relatively good.

Figure 6:
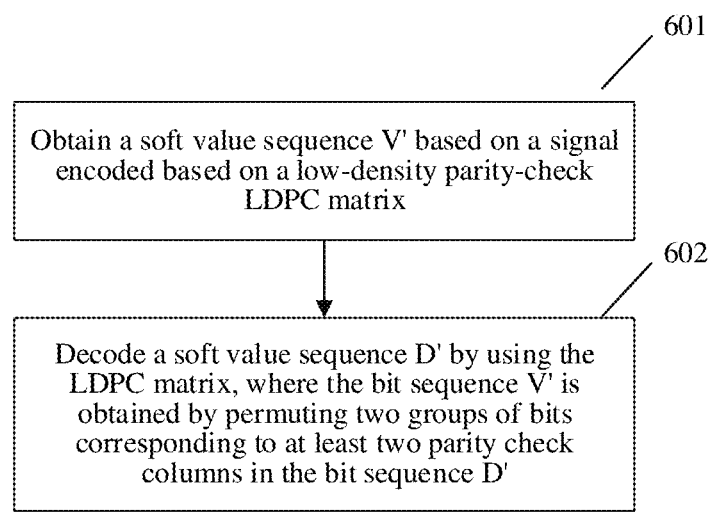
FIG. 6 is a flowchart of an information processing method according to another embodiment of the present disclosure.

FIG. 6 shows an information processing method according to another embodiment of the present disclosure. The method includes the following operations.

601-1: Obtain a signal encoded based on a low-density parity-check LDPC matrix.

In a communications system 400, a communications device 41, as a communications device at a receive end, obtains a signal that is encoded based on the LDPC matrix and that is sent by a communications device 40.

601-2: Obtain a soft value sequence V' based on the signal.

The communications device 40 sends the output bit sequence obtained in the foregoing embodiments to the communications device 41. The output bit sequence in the foregoing embodiments is an output bit sequence obtained after rate matching. The communications device 40 may perform processing such as interleaving and modulation on

TABLE 18

| Permutation sequence of P(j), where 0 ≤ j < n | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|
| | 19 | 20 | 21 | P(a) | P(a + 1) | P(a + 2) | P(a + 3) | P(a + 4) | 27 | 28 | 29 | 30 | 31 | 32 | 33 | 34 | 35 |
| | 36 | 37 | 38 | 39 | 40 | 41 | 42 | 43 | 44 | 45 | 46 | 47 | 48 | 49 | 50 | 51 | 52 |
| | 53 | 54 | 55 | 56 | 57 | 58 | 59 | 60 | 61 | 62 | 63 | 64 | 65 | 66 | 67 | | |

In the foregoing implementation, if the permutation sequence shown in Table 18 is used, during initial transmission, the bit 0 of the bit sequence V may be used as a start location to obtain an output bit sequence E. Because the two groups of bits corresponding to the built-in puncture columns are discarded, regardless of the initial transmission or retransmission, the output bit sequence does not include the two groups of bits corresponding to the built-in puncture columns, namely, the group 0 of bits and the group 1 of bits in the bit sequence D.

Figure 8:
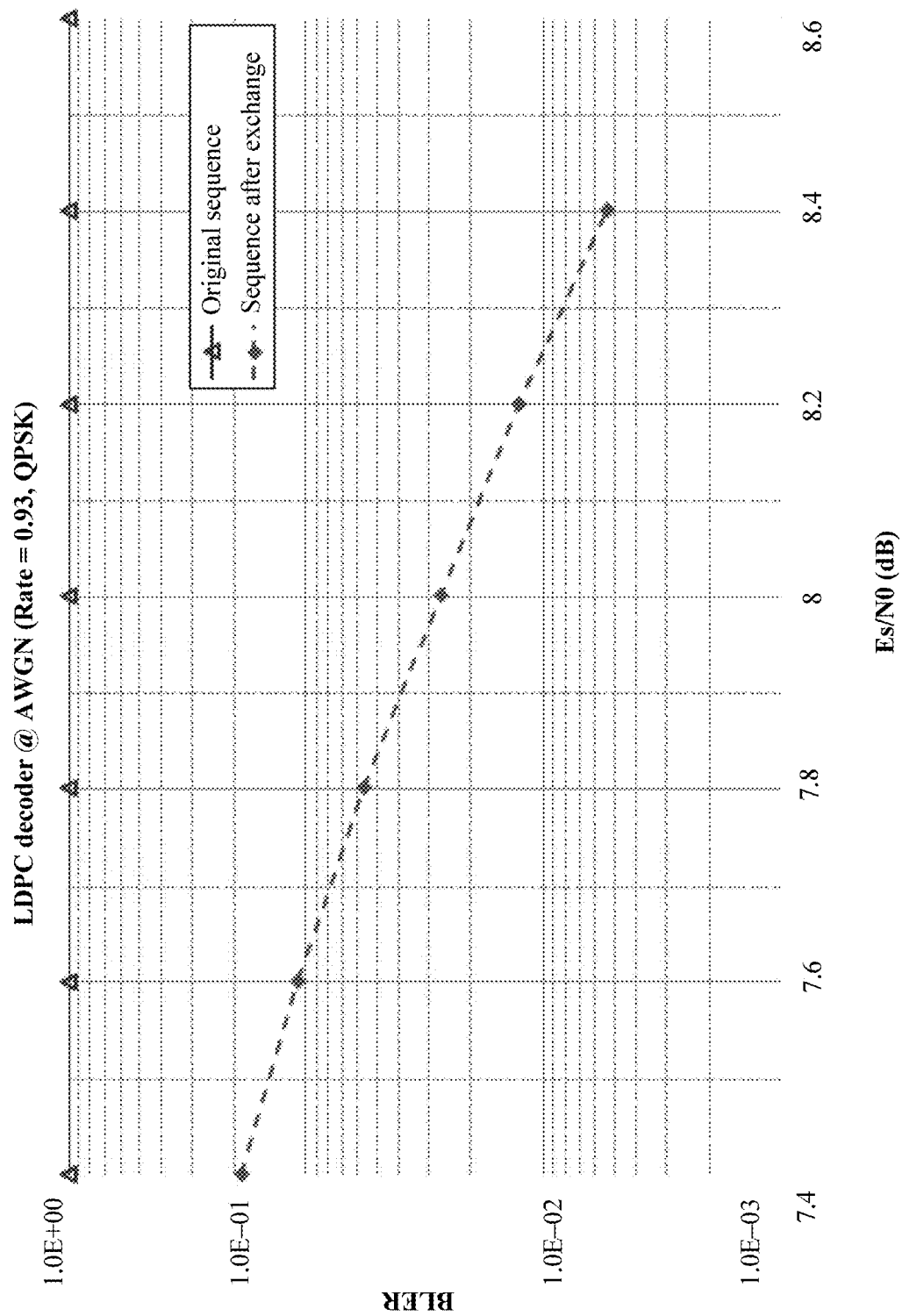
FIG. 8 is a schematic diagram of performance according to another embodiment of the present disclosure.

According to the information processing method provided in this embodiment of the present disclosure, to obtain a higher code rate, the parity bit is punctured. Puncturing of parity columns is considered in processing of an encoded bit sequence, and bit groups corresponding to the columns are permuted, so that fewer entries in each row are punctured. Therefore, a performance requirement of the LDPC code at a high code rate can be satisfied. FIG. 8 is a schematic diagram of performance comparison before and after permutation when a code rate of the LDPC matrix of the base graph 30a is 0.93 and a length of the input sequence is 512 bits. "An original sequence" is represented by a performance curve at different Es/N0s when a to-be-punctured parity check column is not permuted by using the LDPC matrix of the base graph 30a. It may be learned that a block error rate (BLER) in this case is 1, and an LDPC decoder cannot normally work. While "a sequence after exchange" is represented by a performance curve at different Es/N0s after the the output bit sequence obtained after the rate matching, thereby sending a transmit signal corresponding to the output bit sequence. The communications device 41 receives the transmit signal and obtains, after demodulation and deinterleaving, a soft value sequence corresponding to the output bit sequence. One bit in the output bit sequence corresponds to one soft value bit (soft channel bit) in the soft value sequence. Locations of these soft value bits stored in a soft buffer of the communications device 41 are in a one-to-one correspondence to locations of code blocks in a circular buffer of the communications device 40. A size of the soft buffer and a size of the code block in the circular buffer are the same and may be $N_{CB}$.

For example, an output bit sent by the communications device 40 is 1, and after channel transmission, the communications device 41 obtains a soft value bit that corresponds to the output bit and that is 1.45. If a location of the output bit in the code block is the fifth bit, the fifth soft value bit in the soft buffer of the communications device 41 is 1.45. It should be noted that this is only an example for description herein. This embodiment of the present disclosure is not limited thereto. If the output bit sequence obtained by the communications device 40 includes n output bits, the communications device 41 may obtain n corresponding soft value bits. If locations of soft value bits received by the communications device 41 at two times are the same, soft values of the soft value bits received at two times are combined. For example, if a soft value bit received in the first transmission is 1.45 and a soft value bit received in the second transmission is 0.5, 1.95 is obtained after combination. It should be noted that this is only an example herein, and the examples do not constitute a limitation.

The communications device 41 obtains a soft value sequence V' after performing processing such as demodulation on the signal obtained in operation 601. One bit in a bit sequence V corresponds to one soft value bit (soft channel bit) in the soft value sequence V'.

602: Decode a soft value sequence D' by using the LDPC matrix.

A base matrix of the LDPC matrix is represented as a matrix of m rows and n columns. Each column corresponds to a group of Z consecutive soft value bits in the soft value sequence D'. n and Z are both integers greater than 0.

Group j of Z consecutive soft value bits in the soft value sequence V' is group P(j) of Z consecutive soft value bits in the soft value sequence D'. j is an integer, and $0 \leq j < n$.

The soft value sequence V' is obtained by permuting two groups of bits corresponding to at least two parity check columns in the soft value sequence D'. The at least two parity check columns are at least two of column (n−m) to column (n−1) of the base matrix.

It may be learned that locations of permuted parity check columns have features corresponding to those in the foregoing embodiments. For the features, refer to the descriptions of the foregoing embodiments. Details are not described herein again. The soft value sequence V' and the soft value sequence D' are described in the communications device 41, while the bit sequence V and the bit sequence D are described in the communications device 40.

Figure 7:
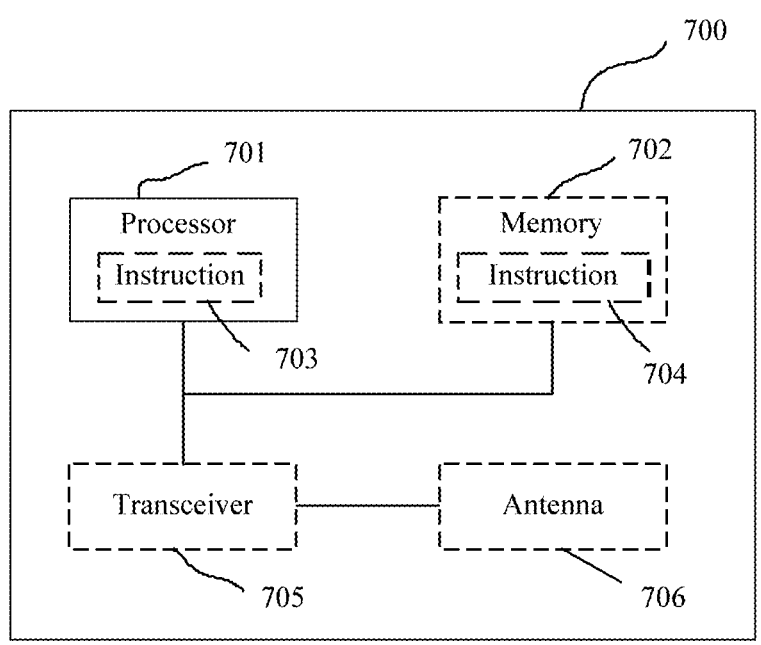
FIG. 7 is a schematic structural diagram of an information processing apparatus according to another embodiment of the present disclosure.

FIG. 7 is a schematic structural diagram of a communications apparatus 700. The communications apparatus 700 may be configured to implement the methods described in the foregoing method embodiments. For implementation, refer to the descriptions in the method embodiments. The communications apparatus 700 may be a chip, a base station, a terminal, or another network device.

The communications apparatus 700 includes one or more processors 701. The processor 701 may be a general purpose processor, a special-purpose processor, or the like. For example, the processor 701 may be a baseband processor or a central processing unit. The baseband processor may be configured to process a communication protocol and communications data. The central processing unit may be configured to: control the communications apparatus (for example, the base station, the terminal, or the chip), execute a software program, and process data of the software program.

In an embodiment, the communications apparatus 700 includes the one or more processors 701. The one or more processors 701 may implement the method in the method embodiment shown in FIG. 5. In another embodiment, the processor 701 may further implement other functions in addition to the method in the method embodiment shown in FIG. 5.

The communications apparatus 700 encodes an input sequence by using a low-density parity-check LDPC matrix, to obtain a bit sequence D, where a base matrix of the LDPC matrix is represented as a matrix of m rows and n columns, each column corresponds to a group of Z consecutive bits in the bit sequence D, and n and Z are both integers greater than 0; and obtains an output bit sequence based on a bit sequence V, where the bit sequence V is obtained by permuting two groups of bits corresponding to at least two parity check columns in the bit sequence D, the at least two parity check columns are at least two of column (n−m) to column (n−1) of the base matrix, group j of Z consecutive bits in the bit sequence V is group P(j) of Z consecutive bits in the bit sequence D, j is an integer, and $0 \leq j < n$.

In an embodiment, the one or more processors 701 may implement the method in the method embodiment shown in FIG. 6. In another embodiment, the processor 701 may further implement other functions in addition to the method in the method embodiment shown in FIG. 6.

The communications apparatus 700 may be configured to obtain a soft value sequence V' based on a signal encoded based on a low-density parity-check LDPC matrix; and decode a soft value sequence D' by using the LDPC matrix, where a base matrix of the LDPC matrix is represented as a matrix of m rows and n columns, each column corresponds to a group of Z consecutive soft value bits in the soft value sequence D', and n and Z are both integers greater than 0. Group j of Z consecutive soft value bits in the soft value sequence V' is group P(j) of Z consecutive soft value bits in the soft value sequence D', j is an integer, and $0 \leq j < n$; and the soft value sequence V' is obtained by permuting two groups of bits corresponding to at least two parity check columns in the soft value sequence D', and the at least two parity check columns are at least two of column (n−m) to column (n−1) of the base matrix.

In an optional design, the processor 701 may also include an instruction 703, and the instruction may be run on the processor, so that the communications apparatus 700 performs the methods described in the foregoing method embodiments.

In another embodiment, the communications apparatus 700 may also include a circuit. The circuit can implement the methods in the foregoing method embodiments.

Optionally, the communications apparatus 700 may include one or more memories 702. The memory stores an instruction 704, and the instruction may be run on the processor, so that the communications apparatus 700 performs the methods according to the foregoing embodiments. Optionally, the memory may further store data. Optionally, the processor may further store an instruction and/or data. The processor and the memory may be separately disposed, or may be integrated together. Optionally, the one or more memories 702 may store parameters, for example, a shift value, a base graph, a matrix expanded based on the base graph, each row in the base matrix, and a lifting factor, that are related to the base matrix. Optionally, the one or more memories 702 may store the base matrix or the matrix expanded based on the base matrix.

Optionally, the communications apparatus 700 may further include a transceiver 705 and an antenna 706. The processor 701 may be referred to as a processing unit. The processor 701 controls the communications apparatus (the terminal or the base station). The transceiver 705 may be referred to as a transceiver unit, a transceiver, a transceiver circuit, or the like, and is configured to implement receiving and sending functions of the communications apparatus by using the antenna 706.

Optionally, the communications apparatus 700 may further include a component configured to produce a transport block CRC, a component used for code block segmentation and a CRC check, an interleaver used for interleaving, a modulator used for modulation processing, or the like. Functions of the components may be implemented by using the one or more processors 701.

Optionally, the communications apparatus 700 may further include a demodulator used for a demodulation operation, a deinterleaver used for deinterleaving, a component used for rate de-matching, or the like. Functions of the components may be implemented by using the one or more processors 701.

A person skilled in the art may further understand that various illustrative logical blocks (illustrative logical block) and operations that are listed in the embodiments of the present disclosure may be implemented by using electronic hardware, computer software, or a combination thereof. Whether the functions are implemented by using hardware or software depends on particular applications and a design requirement of an entire system. A person skilled in the art may use various methods to implement the functions for each particular application, but it should not be considered that the implementation goes beyond the protection scope of the embodiments of the present disclosure.

The various illustrative logical units and circuits described in the embodiments of the present disclosure may implement or operate the described functions by using a general purpose processor, a digital signal processor, an application-specific integrated circuit (ASIC), a field programmable gate array (FPGA) or another programmable logical apparatus, a discrete gate or transistor logic, a discrete hardware component, or a design of any combination thereof. The general purpose processor may be a microprocessor. Optionally, the general purpose processor may alternatively be any conventional processor, controller, microcontroller, or state machine. The processor may alternatively be implemented by a combination of computing apparatuses, such as a digital signal processor and a microprocessor, a plurality of microprocessors, one or more microprocessors together with a digital signal processor core, or any other similar configuration.

Operations of the methods or algorithms described in the embodiments of the present disclosure may be directly embedded into hardware, an instruction executed by the processor, or a combination thereof. The memory may be a RAM memory, a flash memory, a ROM memory, an EPROM memory, an EEPROM memory, a register, a hard disk, a removable magnetic disk, a CD-ROM, or a storage medium of any other form in the art. For example, the memory may be connected to the processor, so that the processor may read information from the memory and write information to the memory. Optionally, the memory may alternatively be integrated into the processor. The processor and the memory may be disposed in the ASIC, and the ASIC may be disposed in user equipment (UE). Optionally, the processor and the memory may be disposed in different components of the UE.

With the descriptions of the foregoing implementations, a person skilled in the art will clearly understand that the present disclosure may be implemented by hardware, firmware or a combination thereof. When the present disclosure is implemented by using a software program, all or some of the present disclosure may be implemented in a form of a computer program product. The computer program product includes one or more computer instructions. When the computer instructions are loaded and executed on a computer, the procedures or functions according to the embodiments of the present disclosure are all or partially generated. When the present disclosure is implemented by using the software program, the foregoing functions may be stored in a computer readable medium or transmitted as one or more instructions or code in the computer readable medium. The computer may be a general-purpose computer, a special-purpose computer, a computer network, or other programmable apparatuses. The computer instructions may be stored in a computer readable storage medium or may be transmitted from one computer readable storage medium to another computer readable storage medium. The computer readable medium includes a computer storage medium and a communications medium, where the communications medium includes any medium that enables a computer program to be transmitted from one place to another. The storage medium may be any available medium accessible to a computer. The following provides an example but is not limited: The computer readable medium may include a RAM, a ROM, an EEPROM, a CD-ROM or another optical disc storage, a magnetic disk storage medium or another magnetic storage device, or any other medium that can be used to carry or store expected program code in a form of an instruction or a data structure and that can be accessed by a computer. In addition, any connection may be appropriately defined as a computer readable medium. For example, if software is transmitted from a website, a server, or another remote source by using a coaxial cable, an optical fiber/cable, a twisted pair, a digital subscriber line (DSL) or wireless technologies such as infrared ray, radio and microwave, the coaxial cable, optical fiber/cable, twisted pair, DSL or wireless technologies such as infrared ray, radio and microwave are included in a definition of a medium to which they belong. For example, a disk and disc used in the present disclosure includes a compact disc (CD), a laser disc, an optical disc, a digital versatile disc (DVD), a floppy disk, and a Blu-ray disc, where the disk usually copies data by a magnetic means, and the disc copies data optically by a laser means. The foregoing combination should also be included in the protection scope of the computer readable medium.

In conclusion, the descriptions above are merely examples of embodiments of the technical solutions of the present disclosure, but are not intended to limit the protection scope of the present disclosure. Any modification, equivalent replacement, improvement, or the like made without departing from and principle of the present disclosure shall fall within the protection scope of the present disclosure.

What is claimed is:

1. An information processing method, comprising:
encoding, by one or more processors of a communications device, an input sequence by using a low-density parity-check (LDPC) matrix, to obtain a bit sequence D, wherein a base matrix of the LDPC matrix is represented as a matrix of m rows and n columns, each column corresponds to a group of Z consecutive bits in the bit sequence D, and n and Z are both integers greater than 0;
obtaining, by the one or more processors of the communications device, an output bit sequence based on a bit sequence V, wherein the bit sequence V is obtained by permuting at least two groups of bits corresponding to at least two parity check columns in the bit sequence D, the at least two parity check columns are at least two of column (n−m) to column (n−1) of the base matrix, group j of Z consecutive bits in the bit sequence V is group P(j) of Z consecutive bits in the bit sequence D, j is an integer, and $0 \leq j < n$; and
sending, by a transmitter of the communications device, a transmit signal corresponding to the output bit sequence, wherein the transmit signal and the LDPC matrix is used by a receiver to obtain a representation of the input sequence based on a channel coding scheme using the LDPC matrix for a data transmission of the input sequence.

2. The method according to claim 1, wherein the at least two parity check columns are at least two columns in {P(a+i)|0≤i<6} of the base matrix, and {P(a+i)|0≤i<6}={22, 23, 24, 25, 26, 27}; and the bit sequence V is obtained by permuting at least two groups of Z consecutive bits in {P(a+i)|0≤i<6} in the bit sequence D.

3. The method according to claim 2, wherein a=20, or a=22.

4. The method according to claim 2, wherein {P(a+i)|0≤i<6} comprises any group of values in following:

{22, 23, 25, 27, 24, 26}, {22, 23, 27, 25, 24, 26}, {22, 27, 23, 25, 24, 26}, {22, 27, 25, 23, 24, 26}, {22, 25, 27, 23, 24, 26}, {22, 25, 23, 27, 24, 26}, {23, 22, 25, 27, 24, 26}, {23, 22, 27, 25, 24, 26}, {23, 25, 22, 27, 24, 26}, {23, 25, 27, 22, 24, 26}, {23, 27, 25, 22, 24, 26}, {23, 27, 22, 25, 24, 26}, {27, 22, 23, 25, 24, 26}, {27, 22, 25, 23, 24, 26}, {27, 23, 22, 25, 24, 26}, {27, 23, 25, 22, 24, 26}, {27, 25, 22, 23, 24, 26}, {27, 25, 23, 22, 24, 26}, {25, 22, 23, 27, 24, 26}, {25, 22, 27, 23, 24, 26}, {25, 23, 22, 27, 24, 26}, {25, 23, 27, 22, 24, 26}, {25, 27, 22, 23, 24, 26}, {25, 27, 23, 22, 24, 26}.

5. The method according to claim 2, wherein {P(a+i)|0≤i<6} comprises any group of values in following:

{22, 23, 25, 27, 26, 24}, {22, 23, 27, 25, 26, 24}, {22, 27, 23, 25, 26, 24}, {22, 27, 25, 23, 26, 24}, {22, 25, 27, 23, 26, 24}, {22, 25, 23, 27, 26, 24}, {23, 22, 25, 27, 26, 24}, {23, 22, 27, 25, 26, 24}, {23, 25, 22, 27, 26, 24}, {23, 25, 27, 22, 26, 24}, {23, 27, 25, 22, 26, 24}, {23, 27, 22, 25, 26, 24}, {27, 22, 23, 25, 26, 24}, {27, 22, 25, 23, 26, 24}, {27, 23, 22, 25, 26, 24}, {27, 23, 25, 22, 26, 24}, {27, 25, 22, 23, 26, 24}, {27, 25, 23, 22, 26, 24}, {25, 22, 23, 27, 26, 24}, {25, 22, 27, 23, 26, 24}, {25, 23, 22, 27, 26, 24}, {25, 23, 27, 22, 26, 24}, {25, 27, 22, 23, 26, 24}, {25, 27, 23, 22, 26, 24}.

6. The method according to claim 2, wherein {P(a+i)|0≤i<6} comprises any group of values in following:

{22, 23, 24, 27, 25, 26}, {22, 23, 27, 24, 25, 26}, {22, 24, 23, 27, 25, 26}, {22, 24, 27, 23, 25, 26}, {22, 27, 23, 24, 25, 26}, {22, 27, 24, 23, 25, 26}, {23, 22, 24, 27, 25, 26}, {23, 22, 27, 24, 25, 26}, {23, 24, 22, 27, 25, 26}, {23, 24, 27, 22, 25, 26}, {23, 27, 22, 24, 25, 26}, {23, 27, 24, 22, 25, 26}, {24, 22, 23, 27, 25, 26}, {24, 22, 27, 23, 25, 26}, {24, 23, 22, 27, 25, 26}, {24, 23, 27, 22, 25, 26}, {24, 27, 22, 23, 25, 26}, {24, 27, 23, 22, 25, 26}, {27, 22, 23, 24, 25, 26}, {27, 22, 24, 23, 25, 26}, {27, 23, 22, 24, 25, 26}, {27, 23, 24, 22, 25, 26}, {27, 24, 22, 23, 25, 26}, {27, 24, 23, 22, 25, 26}.

7. The method according to claim 2, wherein {P(a+i)|0≤i<6} comprises any group of values in following:

{22, 23, 24, 27, 26, 25}, {22, 23, 27, 24, 26, 25}, {22, 24, 23, 27, 26, 25}, {22, 24, 27, 23, 26, 25}, {22, 27, 23, 24, 26, 25}, {22, 27, 24, 23, 26, 25}, {23, 22, 24, 27, 26, 25}, {23, 22, 27, 24, 26, 25}, {23, 24, 22, 27, 26, 25}, {23, 24, 27, 22, 26, 25}, {23, 27, 22, 24, 26, 25}, {23, 27, 24, 22, 26, 25}, {24, 22, 23, 27, 26, 25}, {24, 22, 27, 23, 26, 25}, {24, 23, 22, 27, 26, 25}, {24, 23, 27, 22, 26, 25}, {24, 27, 22, 23, 26, 25}, {24, 27, 23, 22, 26, 25}, {27, 22, 23, 24, 26, 25}, {27, 22, 24, 23, 26, 25}, {27, 23, 22, 24, 26, 25}, {27, 23, 24, 22, 26, 25}, {27, 24, 22, 23, 26, 25}, {27, 24, 23, 22, 26, 25}.

8. The method according to claim 2, wherein {P(a+i)|0≤i<6} comprises any group of values in following:

{22, 23, 26, 27, 24, 25}, {22, 23, 27, 26, 24, 25}, {22, 26, 23, 27, 24, 25}, {22, 26, 27, 23, 24, 25}, {22, 27, 23, 26, 24, 25}, {22, 27, 26, 23, 24, 25}, {23, 22, 26, 27, 24, 25}, {23, 22, 27, 26, 24, 25}, {23, 26, 22, 27, 24, 25}, {23, 26, 27, 22, 24, 25}, {23, 27, 22, 26, 24, 25}, {23, 27, 26, 22, 24, 25}, {26, 22, 23, 27, 24, 25}, {26, 22, 27, 23, 24, 25}, {26, 23, 22, 27, 24, 25}, {26, 23, 27, 22, 24, 25}, {26, 27, 22, 23, 24, 25}, {26, 27, 23, 22, 24, 25}, {27, 22, 23, 26, 24, 25}, {27, 22, 26, 23, 24, 25}, {27, 23, 22, 26, 24, 25}, {27, 23, 26, 22, 24, 25}, {27, 26, 22, 23, 24, 25}, {27, 26, 23, 22, 24, 25}.

9. The method according to claim 2, wherein {P(a+i)|0≤i<6} comprises any group of values in following:

{22, 23, 26, 27, 25, 24}, {22, 23, 27, 26, 25, 24}, {22, 26, 23, 27, 25, 24}, {22, 26, 27, 23, 25, 24}, {22, 27, 23, 26, 25, 24}, {22, 27, 26, 23, 25, 24}, {23, 22, 26, 27, 25, 24}, {23, 22, 27, 26, 25, 24}, {23, 26, 22, 27, 25, 24}, {23, 26, 27, 22, 25, 24}, {23, 27, 22, 26, 25, 24}, {23, 27, 26, 22, 25, 24}, {26, 22, 23, 27, 25, 24}, {26, 22, 27, 23, 25, 24}, {26, 23, 22, 27, 25, 24}, {26, 23, 27, 22, 25, 24}, {26, 27, 22, 23, 25, 24}, {26, 27, 23, 22, 25, 24}, {27, 22, 23, 26, 25, 24}, {27, 22, 26, 23, 25, 24}, {27, 23, 22, 26, 25, 24}, {27, 23, 26, 22, 25, 24}, {27, 26, 22, 23, 25, 24}, {27, 26, 23, 22, 25, 24}.

10. The method according to claim 2, wherein {P(a+i)|0≤i<6} comprises any group of values in following:

{22, 25, 26, 27, 23, 24}, {22, 25, 27, 26, 23, 24}, {22, 26, 25, 27, 23, 24}, {22, 26, 27, 25, 23, 24}, {22, 27, 25, 26, 23, 24}, {22, 27, 26, 25, 23, 24}, {25, 22, 26, 27, 23, 24}, {25, 22, 27, 26, 23, 24}, {25, 26, 22, 27, 23, 24}, {25, 26, 27, 22, 23, 24}, {25, 27, 22, 26, 23, 24}, {25, 27, 26, 22, 23, 24}, {26, 22, 25, 27, 23, 24}, {26, 22, 27, 25, 23, 24}, {26, 25, 22, 27, 23, 24}, {26, 25, 27, 22, 23, 24}, {26, 27, 22, 25, 23, 24}, {26, 27, 25, 22, 23, 24}, {27, 22, 25, 26, 23, 24}, {27, 22, 26, 25, 23, 24}, {27, 25, 22, 26, 23, 24}, {27, 25, 26, 22, 23, 24}, {27, 26, 22, 25, 23, 24}, {27, 26, 25, 22, 23, 24}.

11. The method according to claim 2, wherein {P(a+i)|0≤i<6} comprises any group of values in following:

{22, 25, 26, 27, 24, 23}, {22, 25, 27, 26, 24, 23}, {22, 26, 25, 27, 24, 23}, {22, 26, 27, 25, 24, 23}, {22, 27, 25, 26, 24, 23}, {22, 27, 26, 25, 24, 23}, {25, 22, 26, 27, 24, 23}, {25, 22, 27, 26, 24, 23}, {25, 26, 22, 27, 24, 23}, {25, 26, 27, 22, 24, 23}, {25, 27, 22, 26, 24, 23}, {25, 27, 26, 22, 24, 23}, {26, 22, 25, 27, 24, 23}, {26, 22, 27, 25, 24, 23}, {26, 25, 22, 27, 24, 23}, {26, 25, 27, 22, 24, 23}, {26, 27, 22, 25, 24, 23}, {26, 27, 25, 22, 24, 23}, {27, 22, 25, 26, 24, 23}, {27, 22, 26, 25, 24, 23}, {27, 25, 22, 26, 24, 23}, {27, 25, 26, 22, 24, 23}, {27, 26, 22, 25, 24, 23}, {27, 26, 25, 22, 24, 23}.

12. The method according to claim 1, wherein P(a+5)=26, and P(a+4)=24 or P(a+4)=25; or P(a+5)=25, and P(a+4)=24 or P(a+4)=26; or P(a+5)=24, and P(a+4)=23 or P(a+4)=25 or P(a+4)=26; or P(a+5)=23, and P(a+4)=24.

13. An apparatus, comprising:

one or more processors; and a non-transitory computer-readable storage medium coupled to the processor one or more processors and storing programming instructions for execution by the one or more processors, the programming instructions instruct the apparatus to:

encode an input sequence by using a low-density parity-check LDPC matrix, to obtain a bit sequence D, wherein a base matrix of the LDPC matrix is represented as a matrix of m rows and n columns, each column corresponds to a group of Z consecutive bits in the bit sequence D, and n and Z are both integers greater than 0;

obtain an output bit sequence based on a bit sequence V, wherein the bit sequence V is obtained by permuting at least two groups of bits corresponding to at least two parity check columns in the bit sequence D, the at least two parity check columns are at least two of column (n−m) to column (n−1) of the base matrix, group j of Z consecutive bits in the bit sequence V is group P(j) of Z consecutive bits in the bit sequence D, j is an integer, and 0≤j<n; and send a transmit signal corresponding to the output bit sequence, wherein the transmit signal and the LDPC matrix is used by a receiver to obtain a representation of the input sequence based on a channel coding scheme using the LDPC matrix for a data transmission of the input sequence.

14. The apparatus according to claim 13, wherein the at least two parity check columns are at least two columns in {P(a+i)|0≤i<6} of the base matrix, and {P(a+i)|0≤i<6}={22, 23, 24, 25, 26, 27}; and the bit sequence V is obtained by permuting at least two groups of Z consecutive bits in {P(a+i)|0≤i<6} in the bit sequence D.

15. The apparatus according to claim 14, wherein
P(a+5)=26, and P(a+4)=24 or P(a+4)=25; or
P(a+5)=25, and P(a+4)=24 or P(a+4)=26; or
P(a+5)=24, and P(a+4)=23 or P(a+4)=25 or P(a+4)=26; or
P(a+5)=23, and P(a+4)=24.

16. The apparatus according to claim 15, wherein a=20, or a=22.

17. The apparatus according to claim 15, wherein {P(a+i)|0≤i<6} comprises any group of values in following:
{22, 23, 25, 27, 24, 26}, {22, 23, 27, 25, 24, 26}, {22, 27, 23, 25, 24, 26}, {22, 27, 25, 23, 24, 26}, {22, 25, 27, 23, 24, 26}, {22, 25, 23, 27, 24, 26}, {23, 22, 25, 27, 24, 26}, {23, 22, 27, 25, 24, 26}, {23, 25, 22, 27, 24, 26}, {23, 25, 27, 22, 24, 26}, {23, 27, 25, 22, 24, 26}, {23, 27, 22, 25, 24, 26}, {27, 22, 23, 25, 24, 26}, {27, 22, 25, 23, 24, 26}, {27, 23, 22, 25, 24, 26}, {27, 23, 25, 22, 24, 26}, {27, 25, 22, 23, 24, 26}, {27, 25, 23, 22, 24, 26}, {25, 22, 23, 27, 24, 26}, {25, 22, 27, 23, 24, 26}, {25, 23, 22, 27, 24, 26}, {25, 23, 27, 22, 24, 26}, {25, 27, 22, 23, 24, 26}, {25, 27, 23, 22, 24, 26}.

18. The apparatus according to claim 15, wherein {P(a+i)|0≤i<6} comprises any group of values in following:
{22, 23, 25, 27, 26, 24}, {22, 23, 27, 25, 26, 24}, {22, 27, 23, 25, 26, 24}, {22, 27, 25, 23, 26, 24}, {22, 25, 27, 23, 26, 24}, {22, 25, 23, 27, 26, 24}, {23, 22, 25, 27, 26, 24}, {23, 22, 27, 25, 26, 24}, {23, 25, 22, 27, 26, 24}, {23, 25, 27, 22, 26, 24}, {23, 27, 25, 22, 26, 24}, {23, 27, 22, 25, 26, 24}, {27, 22, 23, 25, 26, 24}, {27, 22, 25, 23, 26, 24}, {27, 23, 22, 25, 26, 24}, {27, 23, 25, 22, 26, 24}, {27, 25, 22, 23, 26, 24}, {27, 25, 23, 22, 26, 24}, {25, 22, 23, 27, 26, 24}, {25, 22, 27, 23, 26, 24}, {25, 23, 22, 27, 26, 24}, {25, 23, 27, 22, 26, 24}, {25, 27, 22, 23, 26, 24}, {25, 27, 23, 22, 26, 24}.

19. The apparatus according to claim 15, wherein {P(a+i)|0≤i<6} comprises any group of values in following:
{22, 23, 24, 27, 25, 26}, {22, 23, 27, 24, 25, 26}, {22, 24, 23, 27, 25, 26}, {22, 24, 27, 23, 25, 26}, {22, 27, 23, 24, 25, 26}, {22, 27, 24, 23, 25, 26}, {23, 22, 24, 27, 25, 26}, {23, 22, 27, 24, 25, 26}, {23, 24, 22, 27, 25, 26}, {23, 24, 27, 22, 25, 26}, {23, 27, 22, 24, 25, 26}, {23, 27, 24, 22, 25, 26}, {24, 22, 23, 27, 25, 26}, {24, 22, 27, 23, 25, 26}, {24, 23, 22, 27, 25, 26}, {24, 23, 27, 22, 25, 26}, {24, 27, 22, 23, 25, 26}, {24, 27, 23, 22, 25, 26}, {27, 22, 23, 24, 25, 26}, {27, 22, 24, 23, 25, 26}, {27, 23, 22, 24, 25, 26}, {27, 23, 24, 22, 25, 26}, {27, 24, 22, 23, 25, 26}, {27, 24, 23, 22, 25, 26}.

20. The apparatus according to claim 15, wherein {P(a+i)|0≤i<6} comprises any group of values in following:
{22, 23, 24, 27, 26, 25}, {22, 23, 27, 24, 26, 25}, {22, 24, 23, 27, 26, 25}, {22, 24, 27, 23, 26, 25}, {22, 27, 23, 24, 26, 25}, {22, 27, 24, 23, 26, 25}, {23, 22, 24, 27, 26, 25}, {23, 22, 27, 24, 26, 25}, {23, 24, 22, 27, 26, 25}, {23, 24, 27, 22, 26, 25}, {23, 27, 22, 24, 26, 25}, {23, 27, 24, 22, 26, 25}, {24, 22, 23, 27, 26, 25}, {24, 22, 27, 23, 26, 25}, {24, 23, 22, 27, 26, 25}, {24, 23, 27, 22, 26, 25}, {24, 27, 22, 23, 26, 25}, {24, 27, 23, 22, 26, 25}, {27, 22, 23, 24, 26, 25}, {27, 22, 24, 23, 26, 25}, {27, 23, 22, 24, 26, 25}, {27, 23, 24, 22, 26, 25}, {27, 24, 22, 23, 26, 25}, {27, 24, 23, 22, 26, 25}.

21. The apparatus according to claim 15, wherein {P(a+i)|0≤i<6} comprises any group of values in following:
{22, 23, 26, 27, 24, 25}, {22, 23, 27, 26, 24, 25}, {22, 26, 23, 27, 24, 25}, {22, 26, 27, 23, 24, 25}, {22, 27, 23, 26, 24, 25}, {22, 27, 26, 23, 24, 25}, {23, 22, 26, 27, 24, 25}, {23, 22, 27, 26, 24, 25}, {23, 26, 22, 27, 24, 25}, {23, 26, 27, 22, 24, 25}, {23, 27, 22, 26, 24, 25}, {23, 27, 26, 22, 24, 25}, {26, 22, 23, 27, 24, 25}, {26, 22, 27, 23, 24, 25}, {26, 23, 22, 27, 24, 25}, {26, 23, 27, 22, 24, 25}, {26, 27, 22, 23, 24, 25}, {26, 27, 23, 22, 24, 25}, {27, 22, 23, 26, 24, 25}, {27, 22, 26, 23, 24, 25}, {27, 23, 22, 26, 24, 25}, {27, 23, 26, 22, 24, 25}, {27, 26, 22, 23, 24, 25}, {27, 26, 23, 22, 24, 25}.

22. The apparatus according to claim 15, wherein {P(a+i)|0≤i<6}1 comprises any group of values in following:
{22, 23, 26, 27, 25, 24}, {22, 23, 27, 26, 25, 24}, {22, 26, 23, 27, 25, 24}, {22, 26, 27, 23, 25, 24}, {22, 27, 23, 26, 25, 24}, {22, 27, 26, 23, 25, 24}, {23, 22, 26, 27, 25, 24}, {23, 22, 27, 26, 25, 24}, {23, 26, 22, 27, 25, 24}, {23, 26, 27, 22, 25, 24}, {23, 27, 22, 26, 25, 24}, {23, 27, 26, 22, 25, 24}, {26, 22, 23, 27, 25, 24}, {26, 22, 27, 23, 25, 24}, {26, 23, 22, 27, 25, 24}, {26, 23, 27, 22, 25, 24}, {26, 27, 22, 23, 25, 24}, {26, 27, 23, 22, 25, 24}, {27, 22, 23, 26, 25, 24}, {27, 22, 26, 23, 25, 24}, {27, 23, 22, 26, 25, 24}, {27, 23, 26, 22, 25, 24}, {27, 26, 22, 23, 25, 24}, {27, 26, 23, 22, 25, 24}.

23. The apparatus according to claim 15, wherein {P(a+i)|0≤i<6} comprises any group of values in following:
{22, 25, 26, 27, 23, 24}, {22, 25, 27, 26, 23, 24}, {22, 26, 25, 27, 23, 24}, {22, 26, 27, 25, 23, 24}, {22, 27, 25, 26, 23, 24}, {22, 27, 26, 25, 23, 24}, {25, 22, 26, 27, 23, 24}, {25, 22, 27, 26, 23, 24}, {25, 26, 22, 27, 23, 24}, {25, 26, 27, 22, 23, 24}, {25, 27, 22, 26, 23, 24}, {25, 27, 26, 22, 23, 24}, {26, 22, 25, 27, 23, 24}, {26, 22, 27, 25, 23, 24}, {26, 25, 22, 27, 23, 24}, {26, 25, 27, 22, 23, 24}, {26, 27, 22, 25, 23, 24}, {26, 27, 25, 22, 23, 24}, {27, 22, 25, 26, 23, 24}, {27, 22, 26, 25, 23, 24}, {27, 25, 22, 26, 23, 24}, {27, 25, 26, 22, 23, 24}, {27, 26, 22, 25, 23, 24}, {27, 26, 25, 22, 23, 24}.

24. The apparatus according to claim 15, wherein {P(a+i)|0≤i<6} comprises any group of values in following:
{22, 25, 26, 27, 24, 23}, {22, 25, 27, 26, 24, 23}, {22, 26, 25, 27, 24, 23}, {22, 26, 27, 25, 24, 23}, {22, 27, 25, 26, 24, 23}, {22, 27, 26, 25, 24, 23}, {25, 22, 26, 27, 24, 23}, {25, 22, 27, 26, 24, 23}, {25, 26, 22, 27, 24, 23}, {25, 26, 27, 22, 24, 23}, {25, 27, 22, 26, 24, 23}, {25, 27, 26, 22, 24, 23}, {26, 22, 25, 27, 24, 23}, {26, 22, 27, 25, 24, 23}, {26, 25, 22, 27, 24, 23}, {26, 25, 27, 22, 24, 23}, {26, 27, 22, 25, 24, 23}, {26, 27, 25, 22, 24, 23}, {27, 22, 25, 26, 24, 23}, {27, 22, 26, 25, 24, 23}, {27, 25, 22, 26, 24, 23}, {27, 25, 26, 22, 24, 23}, {27, 26, 22, 25, 24, 23}, {27, 26, 25, 22, 24, 23}.

25. The apparatus according to claim 13, wherein the programming instructions instruct the processor to:

obtain the output bit sequence by using bit 0 of the bit sequence V as a start location when a=20; or obtain the output bit sequence by using the bit 0 of the bit sequence V as a start location when a=20, wherein the output bit sequence does not comprise the group 0 of bits and the group 1 of bits in the bit sequence D; or obtain the output bit sequence by using bit (2*Z) of the bit sequence V as a start location when a=22.

\* \* \* \* \*

UNITED STATES PATENT AND TRADEMARK OFFICE
CERTIFICATE OF CORRECTION

| | |
|---|---|
| PATENT NO. | : 11,463,108 B2 |
| APPLICATION NO. | : 16/691281 |
| DATED | : October 4, 2022 |
| INVENTOR(S) | : Chen Zheng et al. |

It is certified that error appears in the above-identified patent and that said Letters Patent is hereby corrected as shown below:

In the Claims

In Claim 13, Column 24, Line 55, "coupled to the processor one or more processors" should be --coupled to the one or more processors--.

Signed and Sealed this
Thirty-first Day of January, 2023

Katherine Kelly Vidal
*Director of the United States Patent and Trademark Office*